(12) United States Patent
Vadim et al.

(10) Patent No.: US 10,812,031 B2
(45) Date of Patent: Oct. 20, 2020

(54) ELECTRONIC DEVICE AND METHOD FOR ADJUSTING GAIN OF DIGITAL AUDIO SIGNAL BASED ON HEARING RECOGNITION CHARACTERISTICS

(71) Applicant: SAMSUNG ELECTRONICS CO., LTD., Suwon-si, Gyeonggi-do (KR)

(72) Inventors: Kudryavtsev Vadim, Suwon-si (KR); Byeong Jun Kim, Gwangmyeong-si (KR); Jae-Hyun Kim, Yongin-si (KR); Juhwan Woo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/045,955

(22) Filed: Jul. 26, 2018

(65) Prior Publication Data
US 2019/0036502 A1    Jan. 31, 2019

(30) Foreign Application Priority Data
Jul. 26, 2017    (KR) .................. 10-2017-0094833

(51) Int. Cl.
*H03G 3/30* (2006.01)
*G10L 25/21* (2013.01)
*H04R 29/00* (2006.01)
*H04R 3/04* (2006.01)
*H03G 9/02* (2006.01)
(Continued)

(52) U.S. Cl.
CPC ........... *H03G 3/3005* (2013.01); *G10L 25/21* (2013.01); *H03G 3/3089* (2013.01); *H03G 7/002* (2013.01); *H03G 7/007* (2013.01); *H03G 9/025* (2013.01); *H04R 3/04* (2013.01); *H04R 29/001* (2013.01); *G06N 3/08* (2013.01); *G10L 25/18* (2013.01);
(Continued)

(58) Field of Classification Search
CPC .. H03G 3/13005; H03G 3/3089; H03G 7/002; H03G 7/007; H03G 9/025; H04R 3/04; H04R 29/001; H04R 27/00; H04R 2227/003; H04R 25/30; G10L 25/21; G10L 25/18; G10L 25/30; G06N 3/08
USPC ... 381/56, 58, 60, 94.2, 94.3, 101, 102, 103, 381/104
See application file for complete search history.

(56) References Cited

U.S. PATENT DOCUMENTS

2009/0116664 A1    5/2009  Smirnov et al.
2013/0243227 A1*   9/2013  Kinsbergen ............ H04R 25/70
                                                        381/314
(Continued)

*Primary Examiner* — William A Jerez Lora
(74) *Attorney, Agent, or Firm* — Nixon & Vanderhye P.C.

(57) ABSTRACT

An electronic device according to various embodiments may include a processor, wherein the processor may be configured to designate a maximum amplitude of an audio signal as a designated range, wherein designating the maximum amplitude of the audio signal as the designated range comprises processing the audio signal with the designated range according to a designated gain, to determine, based at least on hearing recognition characteristics of a human per frequency band of the processed audio signal, whether to tolerate distortion in the processed audio signal, to reduce, based at least on determining not to tolerate the distortion in the processed audio signal, a gain of the processed audio signal, and to adjust, based at least on determining to tolerate the distortion in the processed audio signal, the gain of the processed audio signal based on the hearing recognition characteristics.

15 Claims, 18 Drawing Sheets

(51) Int. Cl.
*H03G 7/00* (2006.01)
*G10L 25/30* (2013.01)
*G10L 25/18* (2013.01)
*H04R 27/00* (2006.01)
*G06N 3/08* (2006.01)

(52) U.S. Cl.
CPC .............. *G10L 25/30* (2013.01); *H04R 27/00* (2013.01); *H04R 2227/003* (2013.01)

(56) References Cited

U.S. PATENT DOCUMENTS

2015/0350783 A1 12/2015 Krishnaswamy et al.
2016/0248393 A1* 8/2016 Seefeldt .................. H03G 3/20
2017/0098455 A1* 4/2017 Xu ...................... G10L 21/0232

* cited by examiner

ELECTRONIC DEVICE AND METHOD FOR ADJUSTING GAIN OF DIGITAL AUDIO SIGNAL BASED ON HEARING RECOGNITION CHARACTERISTICS

CROSS-REFERENCE TO RELATED APPLICATION

This application is based on and claims priority under 35 U.S.C. § 119 to Korean Patent Application No. 10-2017-0094833, filed on Jul. 26, 2017, in the Korean Intellectual Property Office, the disclosure of which is incorporated by reference herein in its entirety.

TECHNICAL FIELD

The disclosure relates to an electronic device and a method for processing a digital audio signal.

BACKGROUND

Based on advances in various storage media and various communication schemes, electronic device capable of playing music stored therein or playing music using a streaming service are under development.

SUMMARY

An electronic device according to various embodiments may include a processor, wherein the processor may be configured to designate a maximum amplitude of an audio signal as a designated range, wherein designating the maximum amplitude of the audio signal as the designated range comprises processing the audio signal with the designated range based on a designated gain, to determine, based at least on hearing recognition characteristics of a human per frequency band of the processed audio signal, whether to tolerate a distortion in the processed audio signal, to reduce, based at least on determining not to tolerate the distortion in the processed audio signal, a gain of the processed audio signal, and to adjust, based at least on determining to tolerate the distortion in the processed audio signal, the gain of the processed audio signal based on the hearing recognition characteristics.

An electronic device according to various embodiments may include a speaker, and at least one processor operably coupled with the speaker and configured to determine whether a frequency characteristic of a digital audio signal having a first range wider than a designated range satisfies a designated condition associated with hearing characteristic of a human, to generate, in response to determining that the frequency characteristic satisfies the designated condition, a first digital audio signal having a second range wider than the designated range based at least on the digital audio signal, to generate, in response to determining that the frequency characteristic does not satisfy the designated condition, a second digital audio signal having a third range narrower than the designated range based at least on the digital audio signal, and to output, via the speaker, a first output signal generated based at least on the first digital audio signal or a second output signal generated based at least on the second digital audio signal.

A method of operating an electronic device according to various embodiments may include designating a maximum amplitude of an audio signal as a designated range, processing the audio signal with the designated range according to a designated gain, determining, based at least on hearing recognition characteristics of a human per frequency band of the processed audio signal, whether to tolerate a distortion in the processed audio signal, reducing, based at least on determining not to tolerate the distortion in the processed audio signal, a gain of the processed audio signal, and adjusting, based at least on determining to tolerate the distortion in the processed audio signal, the gain of the processed audio signal based on the hearing recognition characteristics.

A method of an electronic device according to various embodiments may include determining whether a frequency characteristic of a digital audio signal having a first range wider than a designated range satisfies a designated condition associated with hearing characteristic of a human, generating, in response to determining that the frequency characteristic satisfies the designated condition, a first digital audio signal having a second range wider than the designated range based at least on the digital audio signal, generating, in response to determining that the frequency characteristic does not satisfy the designated condition, a second digital audio signal having a third range narrower than the designated range based at least on the digital audio signal, and outputting, via the speaker, a first output signal generated based at least on the first digital audio signal or a second output signal generated based at least on the second digital audio signal.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following description, taken in conjunction with the accompanying drawings, in which.

Throughout the drawings, like reference numerals will be understood to refer to like parts, components and structures.

DETAILED DESCRIPTION

Figure 1:
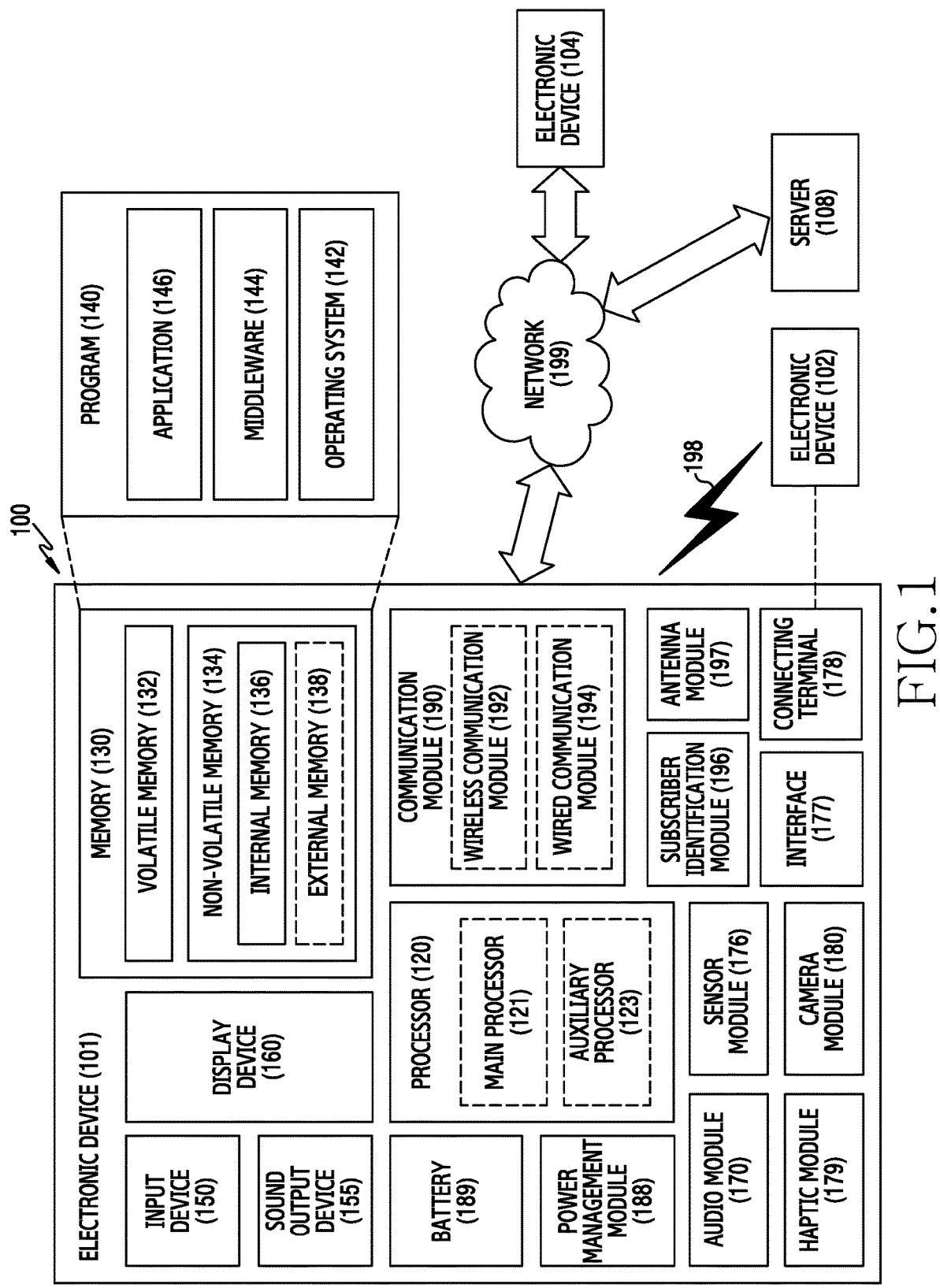
FIG. 1 is a block diagram illustrating an electronic device for adjusting a gain of a digital audio signal based on hearing recognition characteristics in a network environment according to various embodiments.

FIG. 1 is a block diagram illustrating an electronic device 101 for adjusting a gain of a digital audio signal based on hearing recognition characteristics in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor (e.g., including processing circuitry) 120, memory 130, an input device (e.g., including input circuitry) 150, a sound output device 155, a display device 160, an audio module 170, a sensor module 176, an interface 177, a haptic module 179, a camera module 180, a power management module 188, a battery 189, a communication module (e.g., including communication circuitry) 190, a subscriber identification module (SIM) 196, and/or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may include various processing circuitry and execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include various processing circuitry, such as, for example, and without limitation, a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may include various processing circuitry and control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include various input circuitry, such as, for example, and without limitation, a microphone, a mouse, and/or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include various interface circuitry, such as, for example, and without limitation, a high definition multimedia interface (HDMI), a universal serial bus (USB) interface, a secure digital (SD) card interface, and/or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include various communication circuitry including one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth®, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
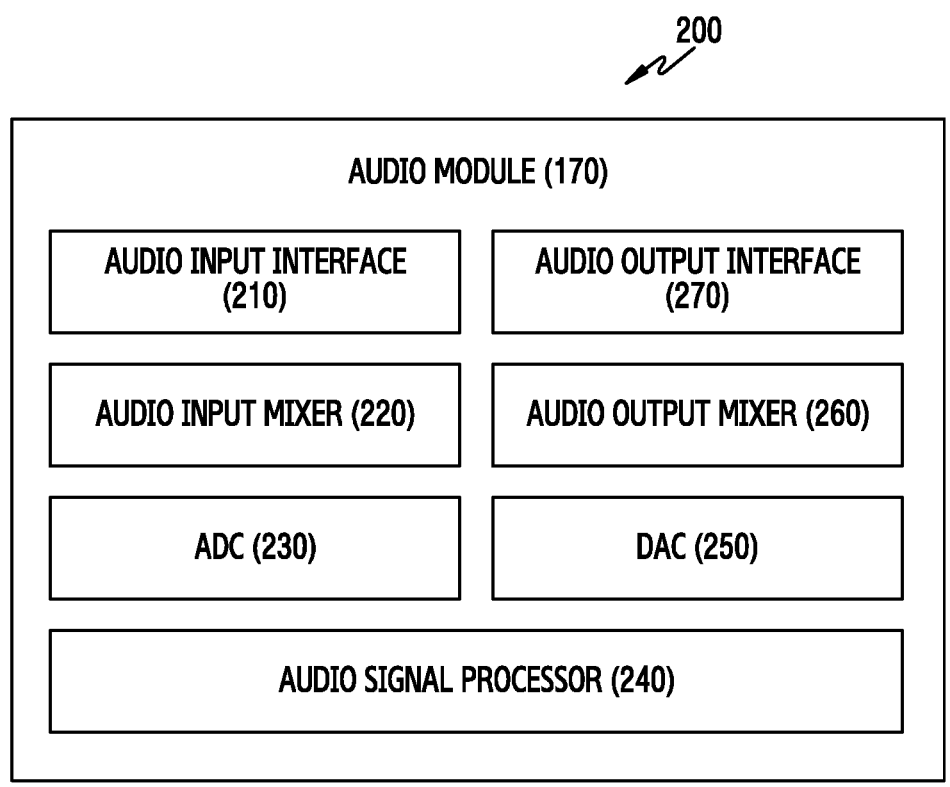
FIG. 2 is a block diagram illustrating an audio module for adjusting a gain of a digital audio signal based on hearing recognition characteristics according to various embodiments.

FIG. 2 is a block diagram 200 illustrating the audio module 170 according to various embodiments. Referring to FIG. 2, the audio module 170 may include, for example, an audio input interface (e.g., including various audio input interface circuitry) 210, an audio input mixer 220, an analog-to-digital converter (ADC) 230, an audio signal processor (e.g., including audio signal processing circuitry) 240, a digital-to-analog converter (DAC) 250, an audio output mixer 260, and/or an audio output interface (e.g., including various audio output interface circuitry) 270.

The audio input interface 210 may include various audio input interface circuitry and receive an audio signal corresponding to a sound obtained from the outside of the electronic device 101 via a microphone (e.g., a dynamic microphone, a condenser microphone, or a piezo microphone) that is configured as part of the input device 150 or separately from the electronic device 101. For example, if an audio signal is obtained from the external electronic device 102 (e.g., a headset or a microphone), the audio input interface 210 may be connected with the external electronic device 102 directly via the connecting terminal 178, or wirelessly (e.g., Bluetooth™ communication) via the wireless communication module 192 to receive the audio signal. According to an embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an embodiment, additionally or alternatively, the audio input interface 210 may receive an audio signal from another component (e.g., the processor 120 or the memory 130) of the electronic device 101.

The audio input mixer 220 may synthesize a plurality of input audio signals into at least one audio signal. For example, according to an embodiment, the audio input mixer 220 may synthesize a plurality of analog audio signals input via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220 into a digital audio signal.

The audio signal processor 240 may include various audio signal processing circuitry and perform various processing on a digital audio signal received via the ADC 230 or a digital audio signal received from another component of the electronic device 101. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor (120) or the memory (130)) of the electronic device 101 into an analog audio signal.

The audio output mixer 260 may synthesize a plurality of audio signals, which are to be output, into at least one audio signal. For example, according to an embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may include various audio output interface circuitry and output an analog audio signal converted by the DAC 250 or, additionally or alternatively, an analog audio signal synthesized by the audio output mixer 260 to the outside of the electronic device 101 via the sound output device 155. The sound output device 155 may include, for example, a speaker, such as a dynamic driver or a balanced armature driver, or a receiver. According to an embodiment, the sound output device 155 may include a plurality of speakers. In such a case, the audio output interface 270 may output audio signals having a plurality of different channels (e.g., stereo channels or 5.1 channels) via at least some of the plurality of speakers. According to an embodiment, the audio output interface 270 may be connected with the external electronic device 102 (e.g., an external speaker or a headset) directly via the connecting terminal 178 or wirelessly via the wireless communication module 192 to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal input via the audio input interface 210 or an audio signal that is to be output via the audio output interface 270. According to an embodiment, the audio amplifier may be configured as a module separate from the audio module 170.

The electronic device according to various embodiments may be one of various types of electronic devices. The electronic devices may include, for example, and without limitation, a portable communication device (e.g., a smart phone), a computer device, a portable multimedia device, a portable medical device, a camera, a wearable device, and/or a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wired), wirelessly, or via a third element.

As used herein, the term "module" may include a unit implemented in hardware, software, or firmware, and/or any combinations thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" may simply refer to a storage medium that is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
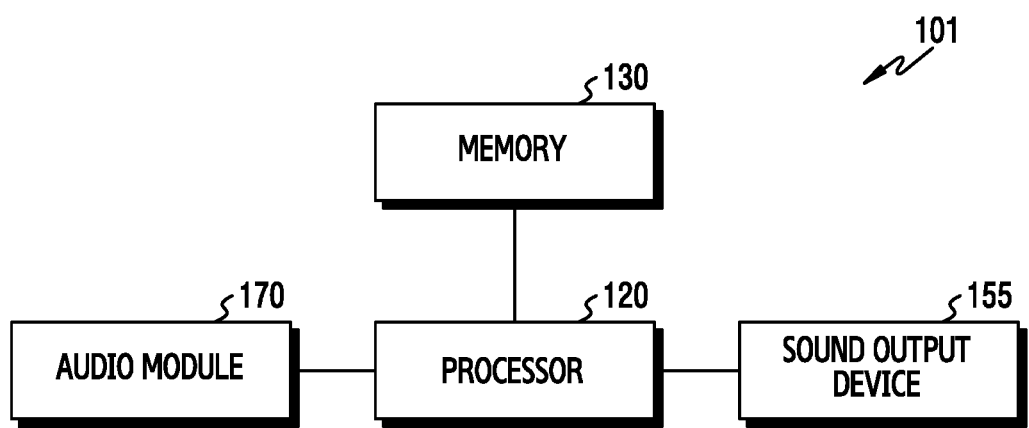
FIG. 3 is a block diagram illustrating an example of a functional configuration of an electronic device for adjusting a gain of a digital audio signal based on hearing recognition characteristics according to various embodiments.

FIG. 3 is a block diagram illustrating an example of a functional configuration of an electronic device 101 for adjusting a gain of a digital audio signal based on hearing recognition characteristics according to various embodiments. This functional configuration may be included in the electronic device 101 of FIG. 1.

Referring to FIG. 3, the electronic device 101 may include a processor (e.g., including processing circuitry) 120, a memory 130, a sound output device (e.g., including sound output circuitry) 155, and an audio module (e.g., including various audio circuitry) 170.

The processor 120 of FIG. 3 may correspond to the processor 120 of FIG. 1.

The processor 120 may include various processing circuitry and process a digital audio signal. In various embodiments, the digital audio signal may be generated based on data received from an external electronic device (e.g., the electronic device 102, the electronic device 104, the server 108 of FIG. 1, etc.). In various embodiments, the digital audio signal may be generated based on data stored in the electronic device 101.

The digital audio signal may need to adjust a gain, in order to prevent and/or reduce saturation of a signal which is output based on the digital audio signal. The digital audio signal may be distributed within a first range which is wider than a designated range. The designated range may be configured to prevent and/or reduce the saturation in the signal which is output via a speaker. For example, the designated range may be a 16-bit range (e.g., −32768~+32768), and the first range may be a 32-bit range.

In various embodiments, the digital audio signal may be a signal within a designated time unit. For example, the processor 120 may process the digital audio signal per frame. In various embodiments, the digital audio signal may be a signal in one sample.

In various embodiments, the processor 120 may determine frequency characteristic of the digital audio signal. The frequency characteristic may be used to identify whether a masking effect occurs for distortion according to clipping of an audio signal which is to be output based on the digital audio signal. The masking effect may indicate a phenomenon where a human cannot perceive another particular sound due to particular sound (e.g., a masker). For example, the processor 120 may determine the frequency characteristic by converting the digital audio signal into a frequency domain.

In various embodiments, based on the determined frequency characteristic, the processor 120 may determine whether to tolerate the distortion according to the clipping in the audio signal which is to be output based on the digital audio signal (e.g., whether to include the distortion according to the clipping in the audio signal to output).

In various embodiments, the processor 120 may determine a gain for the digital audio signal based on the determined frequency characteristic. To adjust a volume of the audio signal to be output based on the digital audio signal, the processor 120 may determine the gain for the digital audio signal. To determine whether to include the distortion according to the clipping in the audio signal to be output based on the digital audio signal, the processor 120 may determine the gain for the digital audio signal. For example, although the audio signal to be output based on the digital audio signal includes the distortion according to the clipping, if the user may not perceive it due to the masking effect, the processor 120 may determine the gain of the digital audio signal, as a first value. The audio signal to be output based on the digital audio signal applied with the gain which is set as the first value may include the distortion according to the clipping. The digital audio signal applied with the gain which is set as the first value may have a second range which is wider than the designated range. For example, if it is estimated that the user may perceive the distortion according to the clipping in the audio signal to be output based on the digital audio signal, the processor 120 may determine the gain of the digital audio signal, as a second value. The audio signal to be output based on the digital audio signal applied with the gain which is set as the second value may not include the distortion according to the clipping. The digital audio signal applied with the gain which is set as the second value may have a third range which is narrower than the designated range.

In various embodiments, to determine the gain for the digital audio signal, the processor 120 may determine at least one parameter (e.g., a limit gain, a target gain (may be referred to as the gain), a reaction rate (e.g., attack or release), etc.). For example, the processor 120 may determine the at least one parameter value, as a value corresponding to the frequency characteristic of the digital audio signal.

In various embodiments, the processor 120 may process a digital input signal which is input from an audio source. The processor 120 may split the digital input signal into a plurality of signals on subbands. For example, for multi-band dynamic range control (MBDRC) on the digital input signal, the processor 120 may split the digital input signal into the multiple signals.

In various embodiments, the processor 120 may be operatively or operably coupled with or coupled to one or more of the memory 130, the sound output device 155, or the audio module 170. For example, the processor 120 may execute instructions stored in the memory 130, for processing the digital input signal and processing the digital audio signal. For example, the processor 120 may control the audio module 170 to convert the digital audio signal to an analog audio signal. For example, the processor 120 may control the sound output device 155 to output the analog audio signal.

The memory of FIG. 3 may correspond to the memory 130 of FIG. 1.

The memory 130 may include instructions for processing the digital input signal. The memory 130 may include instructions for processing the digital audio signal.

The sound output device 155 of FIG. 3 may correspond to the sound output device 155 of FIG. 1.

The sound output device 155 (e.g., a speaker) may be embedded in a housing of the electronic device 101. The housing may provide a space for including the component (e.g., the processor 120, the memory 130, the sound output device 155, or the audio module 170) of the electronic device 101. The housing may be implemented in various forms. At least part of the sound output device 155 in the housing may be exposed to outside. The sound output device 155 may be configured to output the analog audio signal. At least part of the sound output device 155 may be exposed through at least part of a bottom of the housing, to output the analog audio signal.

The audio module 170 of FIG. 3 may correspond to the audio module 170 of FIG. 1 and/or the audio module 170 of FIG. 2.

The audio module 170 may convert the digital audio signal to the analog audio signal.

As such, the electronic device 101 according to various embodiments may determine using the processor 120 whether to tolerate the distortion according to the clipping in the audio signal to be output based on the digital audio signal, process the digital audio signal based on the determination, and thus provide the audio signal with an improved sound quality and/or volume.

Figure 4:
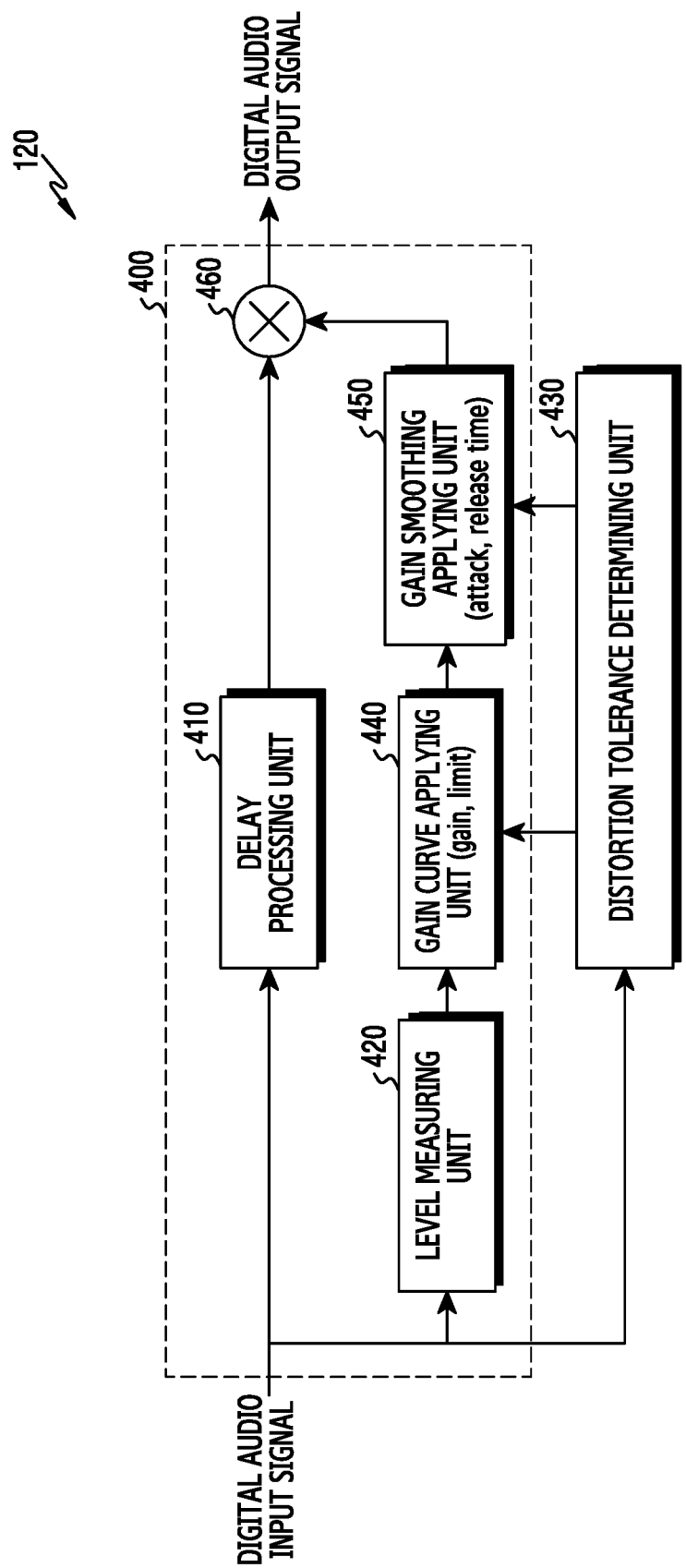
FIG. 4 is a block diagram illustrating an example of a functional configuration of a processor of an electronic device for adjusting a gain of a digital audio signal based on hearing recognition characteristics according to various embodiments.

FIG. 4 is a block diagram illustrating an example of a functional configuration of a processor of an electronic device for adjusting a gain of a digital audio signal based on hearing recognition characteristics according to various embodiments. Such functions of the processor may be executed by the processor 120 of FIG. 1 or the processor 120 of FIG. 3.

Referring to FIG. 4, the processor 120 may include a DRC unit (e.g., including dynamic range control circuitry) 400 and a distortion tolerance determining unit (e.g., including distortion tolerance determining circuitry) 430.

The DRC unit 400 may include a delay processing unit (e.g., including delay processing circuitry) 410, a level measuring unit (e.g., including level measuring circuitry) 420, a gain curve applying unit (e.g., including gain curve applying circuitry) 440, a gain smoothing applying unit (e.g., including gain smoothing applying circuitry) 450, and a gain applying unit (e.g., including gain applying circuitry) 460.

The delay processing unit 410 may delay a digital audio input signal. The digital audio input signal may have a wider range than the designated range. The digital audio input signal may be processed on a frame basis or on a sampling basis. In various embodiments, the digital audio input signal may be produced by combining the signals generated by the MBDRC. The delay processing unit 410 may delay the digital audio input signal by time as required to determine parameters for determining a gain to be applied to the digital audio signal. The parameters may include data (e.g., a target gain, a limit gain, or etc.) indicating a gain curve. The parameters may include data (e.g., attack or release) for smoothing the gain to be applied to the digital audio input signal. The digital audio input signal may be delayed by the time determined at the delay delayer 410 and provided to the gain applying unit 460.

The level measuring unit 420 may receive the digital audio input signal. The digital audio input signal may be received or processed on the frame basis or the sampling basis. The level measuring unit 420 may perform calculation on the digital audio input signal. In various embodiments, the level measuring unit 420 may determine or generate data indicating a peak of the digital audio input signal or data indicating a root mean square (RMS) of the digital audio input signal, based on the digital audio input signal. The level measuring unit 420 may provide the determined data to the gain curve applying unit 440.

The gain curve applying unit 440 may determine data indicating the gain curve, based on at least one of the data received from the level measuring unit 420 or the data received from the distortion tolerance determining unit 430. For example, if receiving from the distortion tolerance determining unit 430 the data determined by the distortion tolerance determining unit 430, the gain curve applying unit 440 may determine the gain curve data, based on the data from the level measuring unit 420 and the received data. The gain curve data may be a target gain and a limit gain.

The gain smoothing applying unit 450 may determine data for smoothing the gain to be applied to the digital audio input signal based on at least one of the data from the gain curve applying unit 440 or the data received from the distortion tolerance determining unit 430. For example, if receiving from the distortion tolerance determining unit 430 the data determined by the distortion tolerance determining unit 430, the gain smoothing applying unit 450 may determine the data for the smoothing, based on the data from the gain curve applying unit 440 and the received data. The data for the smoothing may be an attack time and a release time.

The gain applying unit 460 may generate a digital audio output signal by applying the gain determined based on the gain curve data and the smoothing data, to the digital audio input signal. In various embodiments, the digital audio output signal may have a wider range than the designated range if the distortion tolerance determining unit 430 determines to tolerate distortion according to clipping in the digital audio output signal. In various embodiments, the digital audio output signal may have a narrower range than the designated range if the distortion tolerance determining unit 430 determines not to tolerate the distortion according to the clipping in the digital audio output signal. The gain applying unit 460 may generate the digital audio output signal by applying the determined gain to the digital audio input signal which is delayed at the delay processing unit 410.

The distortion tolerance determining unit 430 may receive the digital audio input signal. The distortion tolerance determining unit 430 may generate or acquire first data by applying fast Fourier transform (FFT) to the digital audio input signal. The distortion tolerance determining unit 430 may generate or obtain data indicating a masking curve of the digital audio input signal. The masking curve data may have masking curve values, and be generated or obtained according to a standard such as moving picture experts group (MPEG)-1. The distortion tolerance determining unit 430 may generate reference data for determining whether to include the distortion according to the clipping in the digital audio output signal, based on the first data and the masking curve data. For example, the distortion tolerance determining unit 430 may generate the reference data based at least in part on a maximum value per frequency bin the first data and the masking curve data.

The distortion tolerance determining unit 430 may generate second data by applying the gain having an initial value to the digital audio input signal. If the second data has a range wider than the designated range, the distortion tolerance determining unit 430 may generate third data by processing (e.g., scaling) the second data to acquire the designated range. For example, the distortion tolerance determining unit 430 may generate or acquire the third data having the designated range by converting or changing at least one value which is greater than a maximum value of the designated range in the second data, to a maximum value of the designated range, and converting or changing at least one value which is smaller than a minimum value of the designated range in the second data, to a minimum value of the designated range. The third data, which is generated by processing the second data having the wider range than the designated range, may include the distortion according to the clipping.

The distortion tolerance determining unit 430 may generate fourth data by applying the FFT to the generated third data.

Based on the fourth data and the reference data, if applying the gain having the initial value to the digital audio output signal, the distortion tolerance determining unit 430 may determine whether the distortion according to the clipping is perceived in the digital audio output signal. In various embodiments, if the fourth data is smaller than or equal to the reference data, the distortion tolerance determining unit 430 may determine that the user does not perceive the distortion according to the clipping in the digital audio output signal to which the gain having the initial value is applied. If the distortion according to the clipping is not perceived in the digital audio output signal, the distortion tolerance determining unit 430 may provide information about at least one parameter required to determine the gain having the initial value, to at least one of the gain curve applying unit 440 or the gain smoothing applying unit 450. In various embodiments, if the fourth data is greater than the reference data, the distortion tolerance determining unit 430 may determine that the user perceives the distortion according to the clipping in the digital audio output signal to which the gain having the initial value is applied. If determining that the distortion according to the clipping is perceived in the digital audio output signal, the distortion tolerance determining unit 430 may adjust or change the gain of the initial value. For example, the distortion tolerance determining unit 430 may adjust or change the gain of the initial value, to a gain decreased from the initial value by a designated value.

The distortion tolerance determining unit 430 may generate updated second data by applying the adjusted gain to the digital audio signal. If the updated second data has a wider range than the designated range, the distortion tolerance determining unit 430 may generate updated third data by processing the second data to obtain the designated range. The distortion tolerance determining unit 430 may generate updated fourth data by applying the FFT to the updated third data.

Based on the updated fourth data and the reference data, if applying the adjusted to the digital audio output signal, the distortion tolerance determining unit 430 may determine whether the distortion according to the clipping is perceived in the digital audio output signal. In various embodiments, if the updated fourth data is smaller than or equal to the reference data, the distortion tolerance determining unit 430 may determine that the user does not perceive the distortion according to the clipping in the digital audio output signal applied with the adjusted gain, and provide information of at least one parameter required to determine the adjusted gain, to at least one of the gain curve applying unit 440 or the gain smoothing applying unit 450. In various embodiments, if the updated fourth data is greater than the reference data, the distortion tolerance determining unit 430 may determine that the user perceives the distortion according to the clipping in the digital audio output signal, and readjust or re-change the adjusted gain. Until the updated fourth data becomes smaller than or equal to the reference data (e.g., until the user does not perceive the distortion according to the clipping), the distortion tolerance determining unit 430 may repeatedly perform the operations for adjusting the gain and determining whether to include the distortion according to the clipping based on the adjusted gain (e.g., generating the second data, generating the third data, generating the fourth data, and determining whether the distortion according to the clipping is perceived in the digital audio output signal).

In various embodiments, the distortion tolerance determining unit 430 may process not to perceive the distortion according to the clipping from in the digital audio output signal, based on pre-stored data. The pre-stored data may be determined by repeatedly adjusting the again and determining whether to include the distortion according to the clipping based on the adjusted gain, through learning. The distortion tolerance determining unit 430 may determine at least one parameter for determining the gain to be applied to the digital audio input signal, by searching the pre-stored data based on spectrum data (e.g., a spectrum histogram) of the digital audio input signal and amplitude data (e.g., an amplitude histogram) of the digital audio input signal. The distortion tolerance determining unit 430 may provide information of the at least one parameter determined, to at least one of the gain curve applying unit 440 or the gain smoothing applying unit 450.

As such, the electronic device 101 according to various embodiments may generate the reference data using the masking curve data and the data determined based on the digital audio input signal, determine using the generated reference data whether the user perceives the distortion according to the clipping in the digital audio output signal with respect to the digital audio input signal, and thus provide an audio signal with an improved sound quality or volume.

Figure 5:
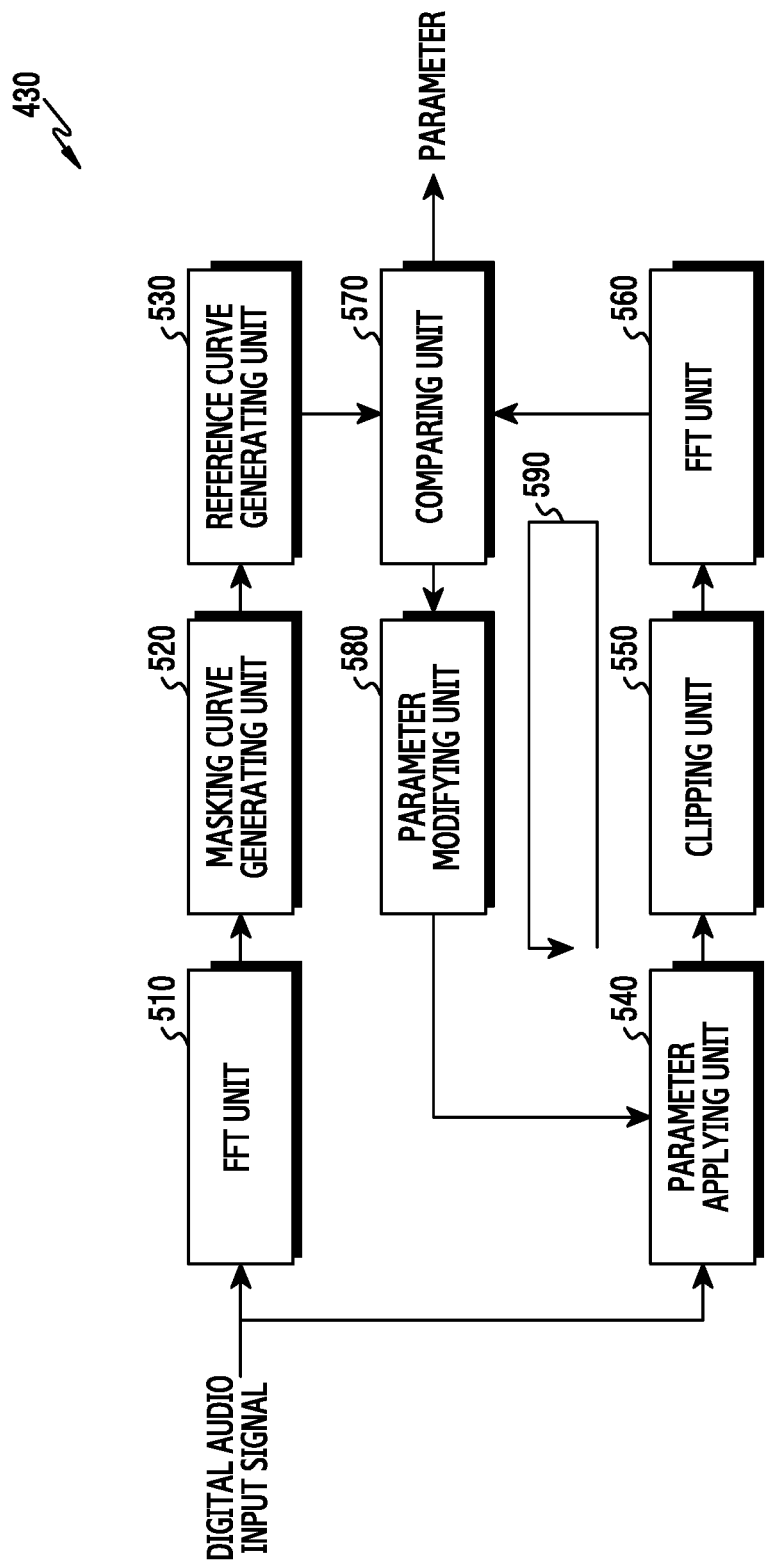
FIG. 5 is a block diagram illustrating an example of a functional configuration of a distortion tolerance determining unit of a processor of an electronic device for adjusting a gain of a digital audio signal based on hearing recognition characteristics according to various embodiments.

FIG. 5 is a block diagram illustrating an example of a functional configuration of a distortion tolerance determining unit of a processor of an electronic device for adjusting a gain of a digital audio signal based on hearing recognition characteristics according to various embodiments. Such functions of the distortion tolerance determining unit may be executed by the distortion tolerance determining unit 430 of FIG. 4.

Figure 6:
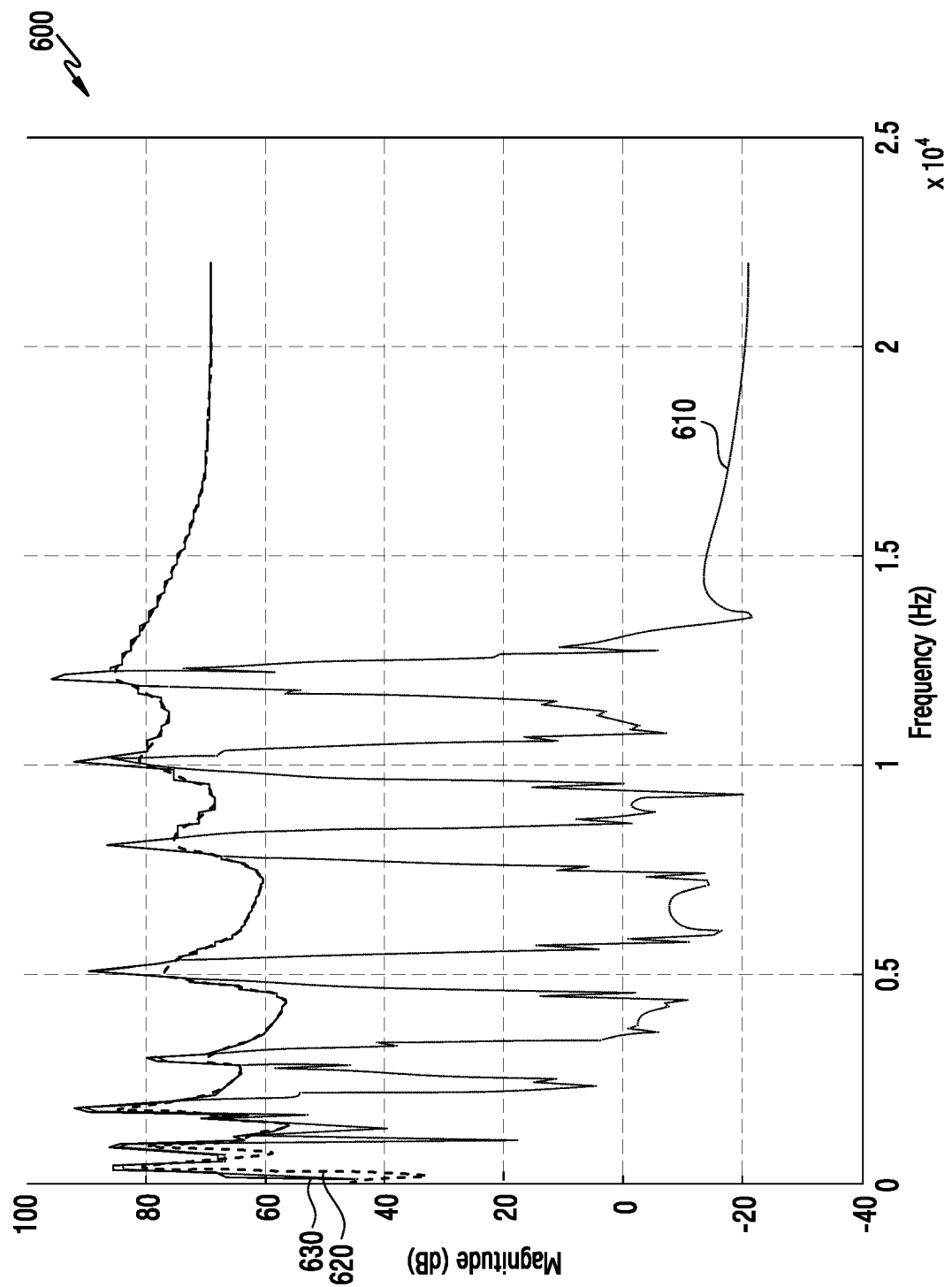
FIG. 6 is a graph illustrating reference data.

FIG. 6 is a graph illustrating reference data. In FIG. 6, a horizontal axis of the graph 600 indicates a frequency, and its unit is hertz (Hz). In FIG. 6, a vertical axis of the graph 600 indicates a magnitude and its unit may be decibel (dB).

Referring to FIG. 5, the distortion tolerance determining unit 430 may include an FFT unit (e.g., including FFT circuitry) 510, a masking curve generating unit (e.g., including masking curve generating circuitry) 520, a reference curve generating unit (e.g., including reference curve generating circuitry) 530, a parameter applying unit (e.g., including parameter applying circuitry) 540, a clipping unit (e.g., including clipping circuitry) 550, an FFT unit (e.g., including FFT circuitry) 560, a comparing unit (e.g., including comparing circuitry) 570, and a parameter modifying unit (e.g., including parameter modifying circuitry) 580.

The FFT unit 510 may receive the digital audio input signal. The FFT unit 510 may generate the first data by applying the FFT to the digital audio input signal. The first data may be provided to the reference curve generating unit 530.

The masking curve generating unit 520 may generate a masking curve for the digital audio input signal or data indicating the masking curve for the digital audio input signal. In various embodiments, the masking curve generating unit 520 may generate the masking curve or the masking curve data according to the standard such as MPEG-1. The masking curve generating unit 520 may provide the reference curve generating unit 530 with information about the masking curve or the masking curve data.

The reference curve generating unit 530 may generate reference data (or a reference curve configured with the reference data) for determining whether to include the distortion according to the clipping in the digital audio output signal, based on the masking curve data (or the masking curve) and the first data. For example, referring to FIG. 6, a curve 610 of the graph 600 may indicate the first data, and a curve 620 of the graph 600 may indicate the masking curve including the masking curve data. The reference curve generating unit 530 may generate the reference data based on the first data and the masking curve data. A curve 630 of the graph 600 may indicate the reference curve configured with the reference data. The reference data may be generated based on a maximum value per frequency bin between the first data and the masking curve data. For example, the reference data may be generated based on Equation 1.

$$\text{Data}(n)_{reference} = \max(\text{Data}(n)_1, \text{Data}(n)_2) \quad (1)$$

In Equation 1, $\text{Data}(n)_1$ may denote the first data in an n-th bin, $\text{Data}(n)_2$ may denote the masking curve data in the n-th bin, and $\text{Data}(n)_{reference}$ may denote the reference data in the n-th bin.

Based on Equation 1, the reference curve generating unit 530 may generate the reference data, as indicated by the reference curve 630 of the graph 600.

The parameter applying unit 540 may receive the digital audio input signal. The parameter applying unit 540 may generate the second data by applying parameters (e.g., a target gain, a limit gain, an attack time, a release time, etc.) for a particular gain (e.g., the gain having the initial value or the gain adjusted or modified by the parameter modifying unit 580) to the digital audio input signal. The parameter applying unit 540 may provide the generated second data to the clipping unit 550.

If the second data has the range wider than the designated range, the clipping unit 550 may generate the third data by processing the second data to obtain the designated range. For example, the clipping unit 550 may generate the third data based on Equation 2.

$$\text{Data}_3 = \begin{cases} 1 & (\text{Data}_2 > 1) \\ -1 & (\text{Data}_2 < 1) \end{cases} \quad (2)$$

In Equation 2, $\text{Data}_2$ may denote the second data, 1 may denote a maximum value of the designated range, −1 may denote a minimum value of the designated range, and $\text{Data}_3$ may denote the third data. Data which is greater than or equal to −1 and smaller than or equal to 1 in the second data may be set identically in the third data.

The clipping unit 550 may provide the third data to the FFT unit 560.

The FFT unit 560 may generate the fourth data by applying the FFT to the third data. The FFT unit 560 may provide the fourth data to the comparing unit 570.

The comparing unit 570 may receive the fourth data and the reference data. The comparing unit 570 may compare the fourth data and the reference data. If the fourth data is smaller than or equal to the reference data, the comparing unit 570 may provide the information of the parameters for the particular gain, to at least one of the gain curve applying unit 440 or the gain smoothing applying unit 450. If at least part of the fourth data is greater than the reference data, the comparing unit 570 may provide the parameter information for the particular gain, to the parameter modifying unit 580.

The parameter modifying unit 580 may adjust or change the parameters for the particular gain. In various embodiments, the parameter modifying unit 580 may adjust or change the parameters for the particular gain, wherein the fourth data becomes smaller than or equal to the reference data. The parameter modifying unit 580 may provide information of the adjusted parameters to the parameter applying unit 540.

The distortion tolerance determining unit 430 may repeat the operations along a loop 590 until the fourth data becomes smaller than or equal to the reference data.

Figure 7:
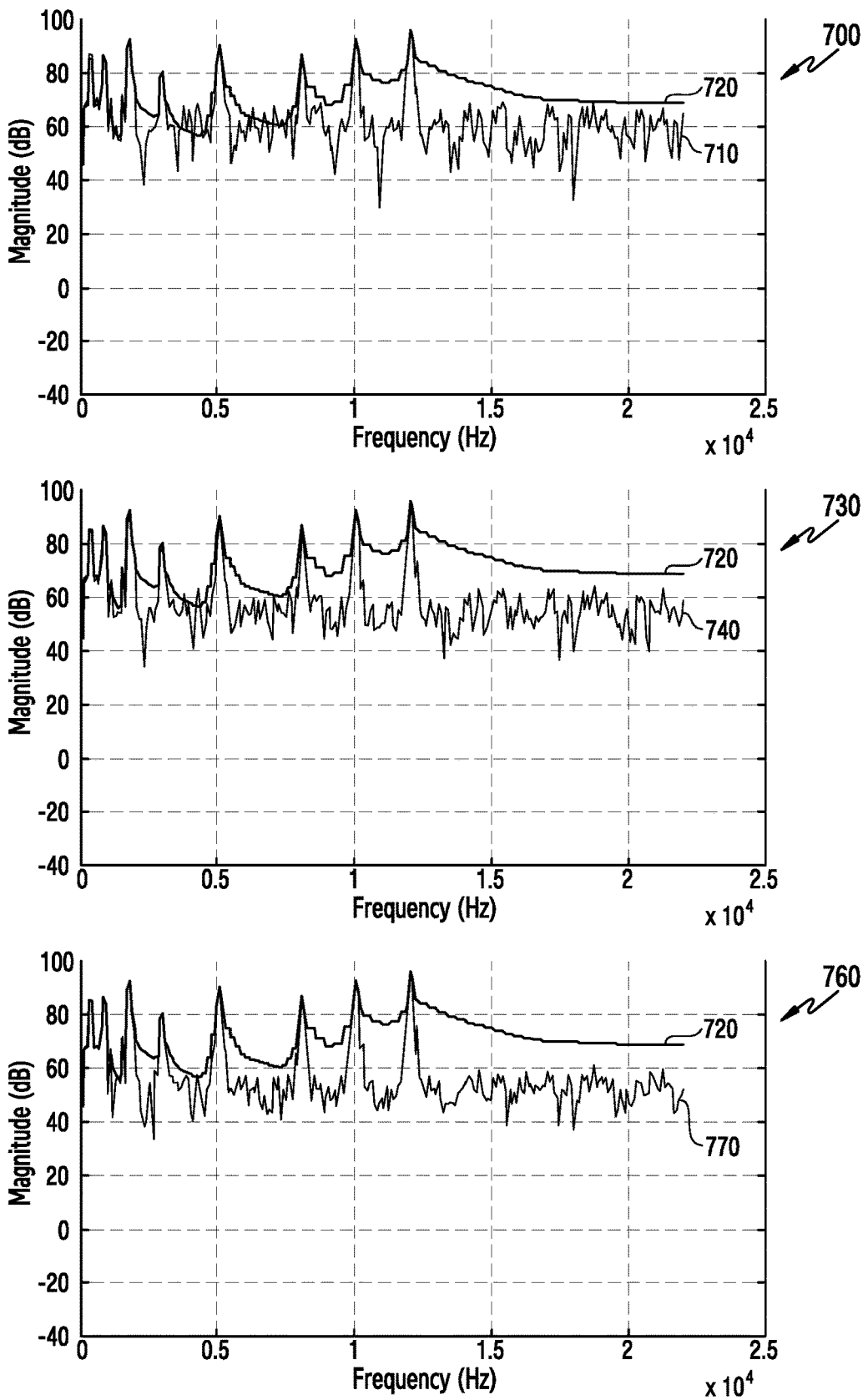
FIG. 7 includes graphs illustrating operations of a distortion tolerance determining unit according to various embodiments.

FIG. 7 includes graphs illustrating operations of a distortion tolerance determining unit according to various embodiments. In FIG. 7, horizontal axes of a graph 700, a graph 730, and a graph 760 indicate the frequency, and their unit may be the Hz. In FIG. 7, vertical axes of the graph 700, the graph 730, and the graph 760 indicate the magnitude and their unit may be the dB.

Referring to FIG. 7, in the graph 700, a curve 710 may indicate the fourth data and a curve 720 may indicate the reference data. In the graph 700, part of the curve 710 may be greater than the curve 720 in the magnitude. Since part of the curve 710 is greater than the curve 720 in the magnitude, the digital audio output signal to be output based on the fourth data may include the distortion according to the clipping which may be perceived by the user. To prevent and/or reduce the user from perceiving the distortion according to the clipping, the distortion tolerance determining unit 430 may adjust at least one parameter for determining the gain to be applied to the digital audio output signal.

In the graph 730, a curve 740 may indicate the fourth data generated based on the at least one parameter adjusted by the distortion tolerance determining unit 430, and a curve 720 may indicate the reference data. In the graph 730, part of the curve 740 may be greater than the curve 720 in the magnitude. Since part of the curve 740 is greater than the curve 720 in the magnitude, the digital audio output signal to be output based on the fourth data may include the distortion according to the clipping which may be perceived by the user. To prevent and/or reduce the user from perceiving the distortion according to the clipping, the distortion tolerance determining unit 430 may readjust at least one parameter for determining the gain to be applied to the digital audio output signal.

In the graph 760, a curve 770 may indicate the fourth data generated based on the at least one parameter readjusted by the distortion tolerance determining unit 430, and a curve 720 may indicate the reference data. In the graph 760, the fourth data of the curve 770 may be smaller than or equal to the reference data of the curve 720 in the value. Since the curve 770 is disposed below the curve 720 (including coincidence of the curve 770 and the curve 720), the user may not perceive the distortion according to the clipping in the digital audio output signal to be output based on the fourth data.

As such, using the reference data for determining whether the distortion according to the clipping is perceived by the user, the electronic device 101 according to various embodiments may adjust at least one parameter for determining the gain until the distortion according to the clipping is not perceived by the user. Thus, the electronic device 101 according to various embodiments may output the audio signal with the improved sound quality or volume.

Figure 8:
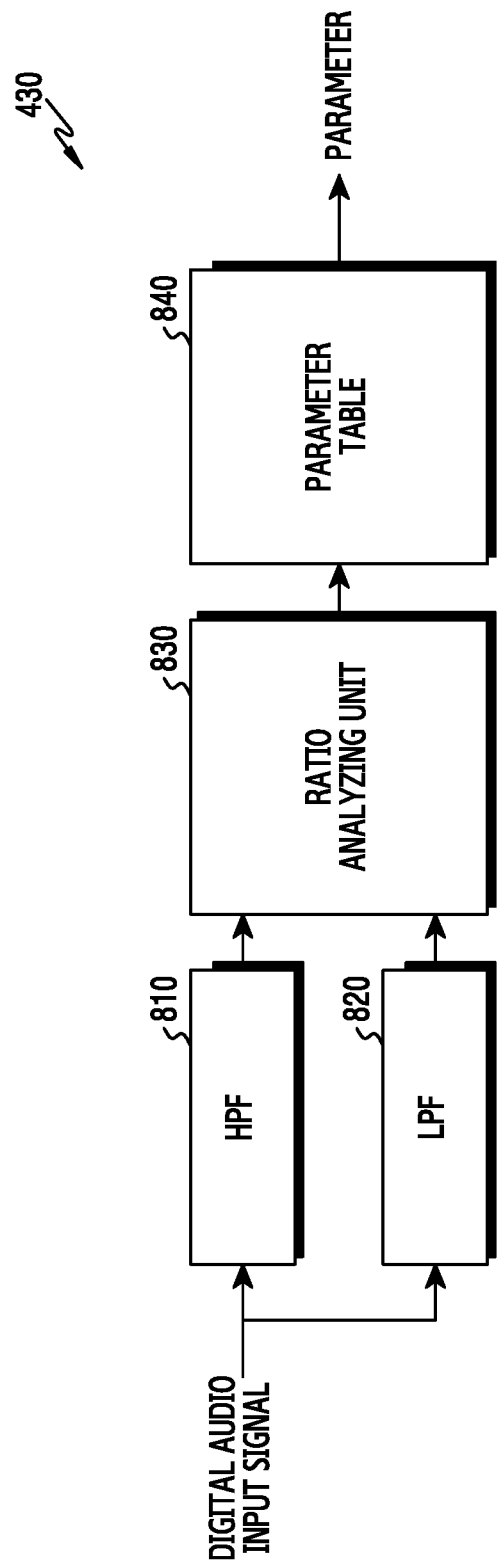
FIG. 8 is a block diagram illustrating another example of a functional configuration of a distortion tolerance determining unit of a processor of an electronic device for adjusting a gain of a digital audio signal based on hearing recognition characteristics according to various embodiments.

FIG. 8 is a block diagram illustrating another example of a functional configuration of a distortion tolerance determining unit of a processor of an electronic device for adjusting a gain of a digital audio signal based on hearing recognition characteristics according to various embodiments. Such functions of the distortion tolerance determining unit may be executed by the distortion tolerance determining unit 430 of FIG. 4.

Figure 9:
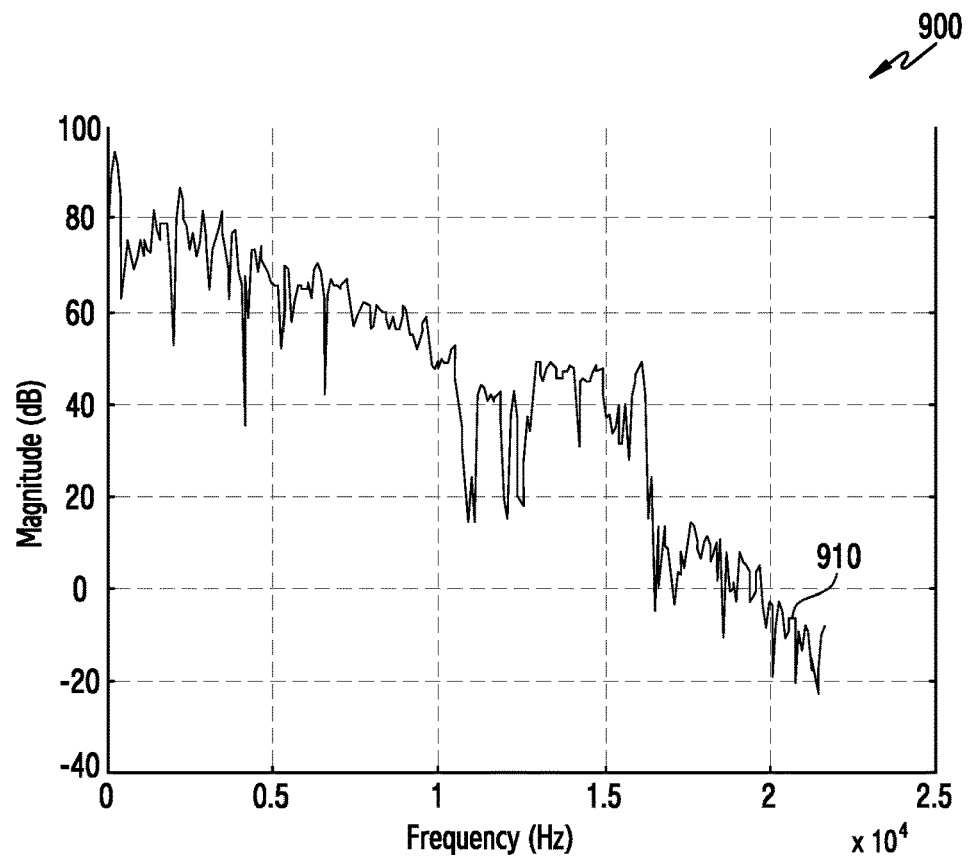
FIG. 9 includes graphs illustrating energy distribution of a digital audio input signal.
Figure 9:
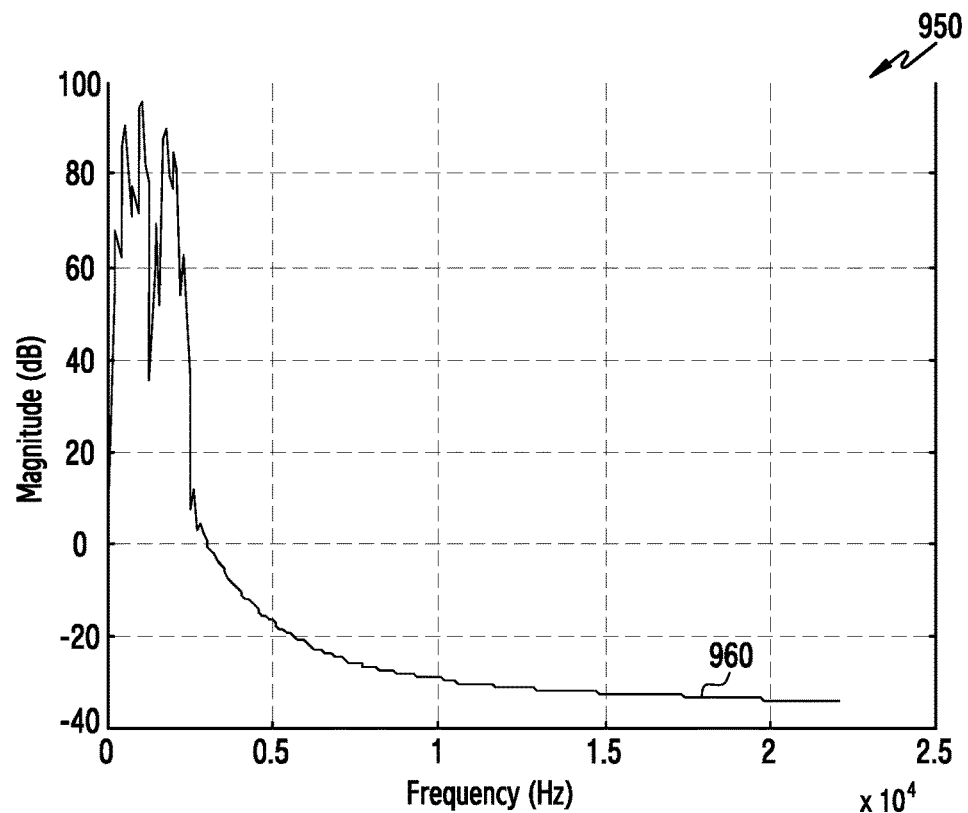

FIG. 9 includes graphs illustrating energy distribution of a digital audio input signal. In FIG. 9, horizontal axes of a graph 900 and a graph 950 indicate the frequency, and their unit may be the Hz. In FIG. 9, vertical axes of the graph 900 and the graph 950 indicate the magnitude and their unit may be the dB.

Referring to FIG. 8, the distortion tolerance determining unit 430 may include a high pass filter (HPF) 810, a low pass filter (LPF) 820, a ratio analyzing unit (e.g., including ratio analyzing circuitry) 830, and a parameter table 840.

The HPF 810 may receive the digital audio input signal. The HPF 810 may identify a first signal having a higher frequency than a first reference frequency in the digital audio input signal. In various embodiments, the HPF 810 may acquire the first signal by filtering out a second signal having a lower frequency than the first reference frequency in the digital audio input signal. The HPF 810 may provide the first signal to the ratio analyzing unit 830.

The LPF 820 may receive the digital audio input signal. The LPF 820 may identify a third signal having a lower frequency than a second reference frequency in the digital audio input signal. The second reference frequency may have the same value as the first reference frequency, or a different value. In various embodiments, the LPF 820 may acquire the third signal by filtering out a fourth signal having a higher frequency than the second reference frequency. The LPF 820 may provide the third signal to the ratio analyzing unit 830.

The ratio analyzing unit 830 may determine energy distribution of the digital audio input signal based on energy of the first signal and energy of the third signal. In various embodiments, the ratio analyzing unit 830 may determine a ratio between the energy of the first signal having the higher frequency than the first reference frequency and the energy of the third signal having the lower frequency than the second reference frequency.

For example, referring to FIG. 9, a curve 910 of the graph 900 and a curve 960 of the graph 950 may indicate the energy distribution of the digital audio input signal. The curve 910 may uniformly distribute the energy per frequency, compared with the curve 960. If the energy is uniformly distributed per frequency (e.g., in the graph 910), the user may not perceive the distortion according to the clipping, due to the masking effect. If the energy is concentrated in a particular frequency band (e.g., in the graph 960), the user may perceive the distortion according to the clipping. To determine whether the distortion according to the clipping is perceived, the ratio analyzing unit 830 may determine the ratio between the energy of the first signal and the energy of the third signal.

The ratio analyzing unit 830 may provide information of the determined ratio to the parameter table 840.

The parameter table 840 may receive the determined ratio information from the ratio analyzing unit 830. The parameter table 840 may store reference information about at least one parameter for determining a gain mapped per ratio between the energy of the first signal having the higher frequency than the first reference frequency and the energy of the third signal having the lower frequency than the second reference frequency. The parameter table 840 may identify at least one parameter mapped to the information received from the ratio analyzing unit 830, in the reference information. The parameter table 840 may provide information of the identified at least one parameter, to at least one of the gain curve applying unit 440 or the gain smoothing applying unit 450.

As such, the electronic device 101 according to various embodiments may determine at least one parameter using the pre-determined parameter table according to the energy distribution of the digital audio input signal, determine the gain for the digital audio input signal based on the at least one parameter determined, and thus lessen complexity required to determine the gain.

Figure 10:
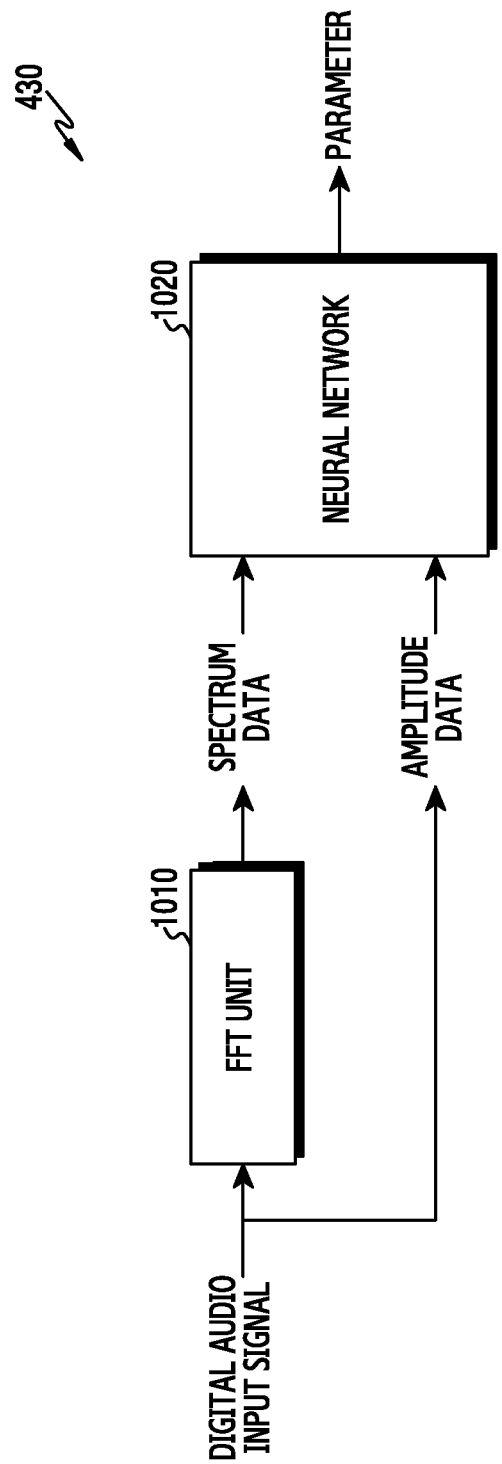
FIG. 10 is a block diagram illustrating yet another example of a functional configuration of a distortion tolerance determining unit of a processor of an electronic device for adjusting a gain of a digital audio signal based on hearing recognition characteristics according to various embodiments.

FIG. 10 is a block diagram illustrating yet another example of a functional configuration of a distortion tolerance determining unit of a processor of an electronic device for adjusting a gain of a digital audio signal based on hearing recognition characteristics according to various embodiments. Such functions of the distortion tolerance determining unit may be executed by the distortion tolerance determining unit 430 of FIG. 4.

Referring to FIG. 10, the distortion tolerance determining unit 430 may include an FFT unit (e.g., including FFT circuitry) 1010 and a neural network 1020.

The FFT unit 1010 may receive the digital audio input signal. The FFT unit 1010 may generate or acquire spectrum data of the digital audio input signal by applying the FFT to the digital audio input signal. The spectrum data may include a spectrum histogram. The spectrum data may be provided to the neural network 1020.

The neural network 1020 may receive the spectrum data. The neural network 1020 may receive amplitude data of the digital audio input signal. The amplitude data may include an amplitude histogram.

The neural network 1020 may store (or read from the memory 130) reference information obtained by machine learning using the functional configuration of FIG. 5. The reference information may include a plurality of parameters associated with a combination of the spectrum data and the amplitude data. The parameters may be used for the gain to be applied to the digital audio input signal. For example, the reference information may include a set k of at least one parameter mapped to (spectrum data, amplitude data)=(a, b), and a set l of at least one parameter mapped to (spectrum data, amplitude data)=(c, d).

The neural network 1020 may provide at least one of the gain curve applying unit 440 or the gain smoothing applying unit 450, with set information of at least one parameter (e.g., a target gain, a limit gain, an attack time, or a release time) corresponding to the received spectrum data and the received amplitude data, in the reference information.

As such, the electronic device 101 according to various embodiments may reduce complexity in determining whether to include the distortion according to the clipping in the output audio signal, by virtue of the neural network 1020 using the reference information determined through the machine learning.

Figure 11:
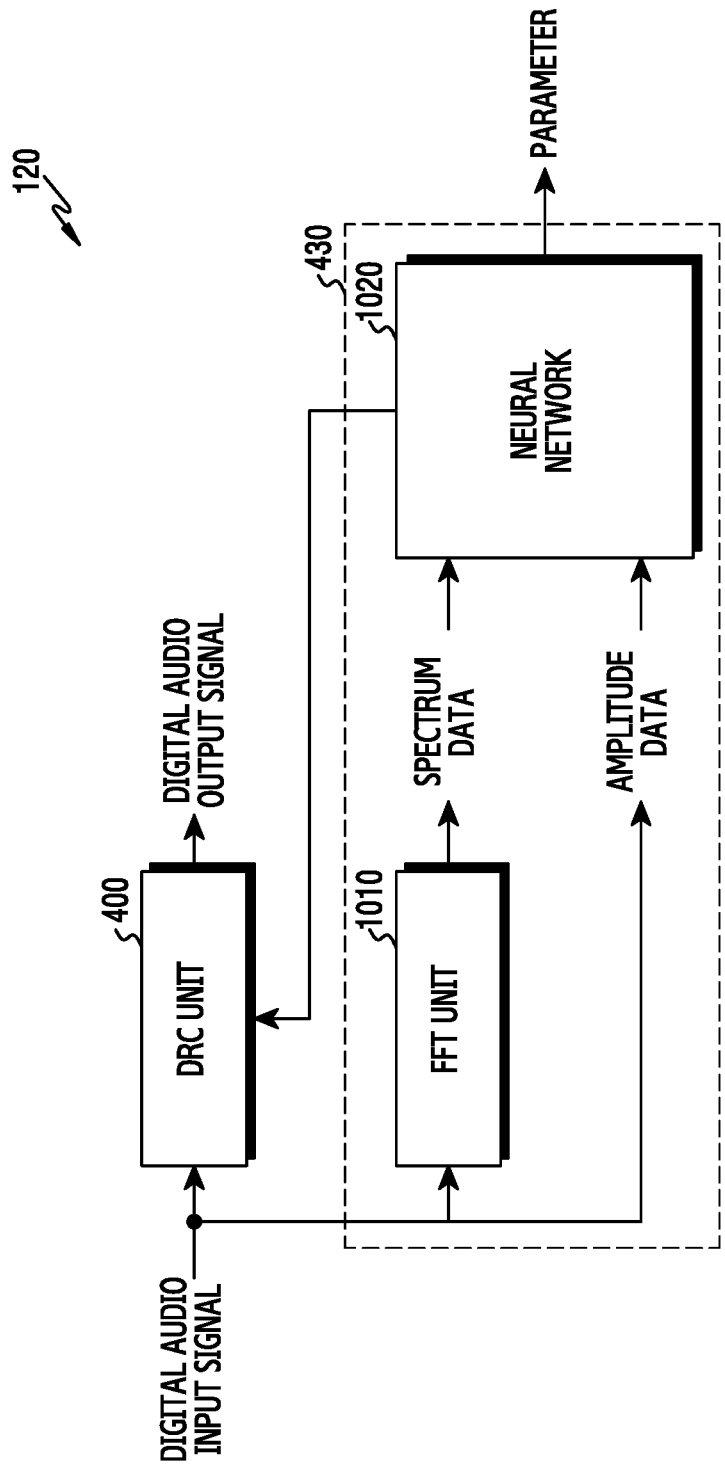
FIG. 11 is a block diagram illustrating an example of relationship between a dynamic range control (DRC) unit and a distortion tolerance determining unit of a processor of an electronic device for adjusting a gain of a digital audio signal based on hearing recognition characteristics according to various embodiments.

FIG. 11 is a block diagram illustrating an example of relationship between a DRC unit and a distortion tolerance determining unit of a processor of an electronic device for adjusting a gain of a digital audio signal based on hearing recognition characteristics according to various embodiments. The relationship may be configured in the processor 120 of FIG. 1 or the processor 120 of FIG. 3.

Referring to FIG. 11, the processor 120 may include a DRC unit (e.g., including dynamic range control circuitry) 400 and a distortion tolerance determining unit (e.g., including distortion tolerance determining circuitry) 430.

The distortion tolerance determining unit 430 may receive the digital audio input signal. The distortion tolerance determining unit 430 may obtain amplitude data of the digital audio input signal. An FFT unit 1010 of the distortion tolerance determining unit 430 may obtain spectrum data of the received digital audio input signal by applying the FFT to the received digital audio input signal. The amplitude data and the spectrum data may be provided to a neural network 1020.

Based on the reference information, the neural network 1020 may determine at least one parameter corresponding to the amplitude data and the spectrum data. The neural network 1020 may provide information of the determined at least one parameter to the DRC unit 400. In various embodiments, the neural network 1020 may provide the determined at least one parameter information to at least one of a gain curve applying unit 440 of the DRC unit 400 or a gain smoothing applying unit 450 of the DRC unit 400.

The DRC unit 400 may receive the digital audio input signal. The DRC unit 400 may receive the determined at least one parameter information from the neural network 1020. The DRC unit 400 may generate the digital audio output signal by applying the gain determined based at least in part on the at least one parameter information, to the received digital audio input signal.

Figure 12:
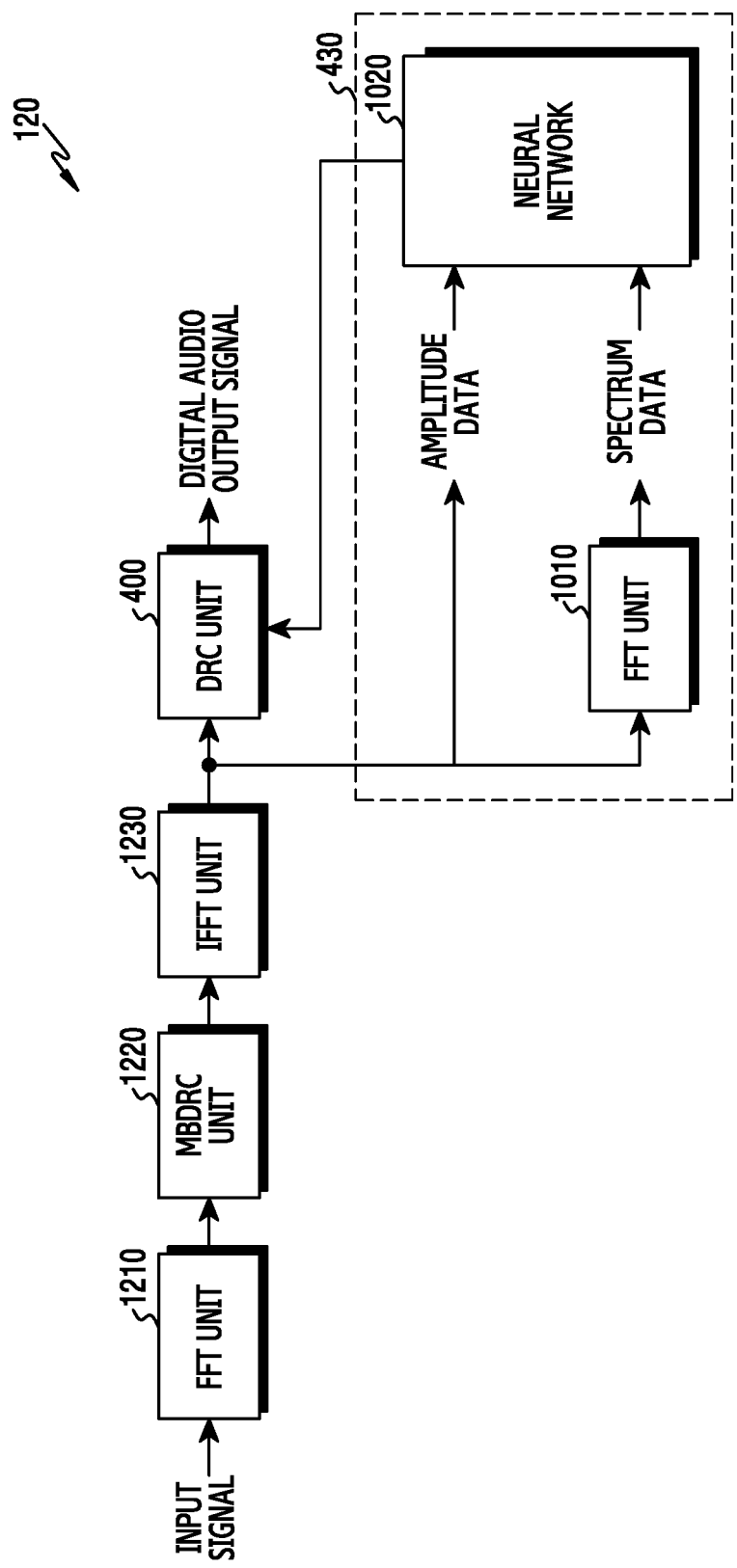
FIG. 12 is a block diagram illustrating another example of a functional configuration of a processor of an electronic device for adjusting a gain of a digital audio signal based on hearing recognition characteristics according to various embodiments.

FIG. 12 is a block diagram illustrating another example of a functional configuration of a processor of an electronic device for adjusting a gain of a digital audio signal based on hearing recognition characteristics according to various embodiments. Such functions of the processor may be carried out by the processor 120 of FIG. 1 or the processor 120 of FIG. 3.

Referring to FIG. 12, the processor 120 may include an FFT unit (e.g., including FFT circuitry) 1210, an MBDRC unit (e.g., including MBDRC circuitry) 1220, an inverse FFT (IFFT) unit (e.g., including inverse FFT circuitry) 1230, a DRC unit (e.g., including dynamic range control circuitry) 400, and a distortion tolerance determining unit (e.g., including distortion tolerance determining circuitry) 430.

The FFT unit 1210 may receive an input signal. The input signal may be a digital signal on a band including a plurality of subbands. The FFT unit 1210 may generate a first signal by applying the FFT the input signal. The FFT unit 1210 may provide the first signal to the MBDRC unit 1220.

The MBDRC unit 1220 may receive the first signal. The MBDRC unit 1220 may generate a plurality of signals on the subbands based on the first signal. In various embodiments, the MBDRC unit 1220 may split the first signal into the signals on the subbands based on the subband. The MBDRC unit 1220 may perform the DRC on the signals. The MBDRC unit 1220 may generate a second signal by combining the DRC-processed signals. The second signal may be provided to the IFFT unit 1230.

The IFFT unit 1230 may generate a third signal by applying IFFT to the second signal. The third signal may be the digital audio input signal. The third signal may be provided to the DRC unit 400 and the distortion tolerance determining unit 430.

The distortion tolerance determining unit 430 may generate the amplitude data based on the received third signal. The distortion tolerance determining unit 430 may generate the spectrum data at the FFT unit 1010 based on the received third signal. The distortion tolerance determining unit 430 may determine at least one parameter for the gain to be applied to the third signal, at the neural network 1020 based on the amplitude data and the spectrum data. Information of the at least one parameter determined may be provided to the DRC unit 400.

Based at least in part on the received third signal and the received at least one parameter information, the DRC unit 400 may determine the gain to be applied to the third signal. The DRC unit 400 may generate the digital audio output signal by applying the gain to the third signal.

As such, in the configuration including the MBDRC unit 1220, the electronic device 101 according to various embodiments may determine to tolerate the distortion according to the clipping. Thus, the electronic device 101 configured to conduct the MBDRC may output the audio signal of the improved sound quality or volume through the speaker.

Figure 13:
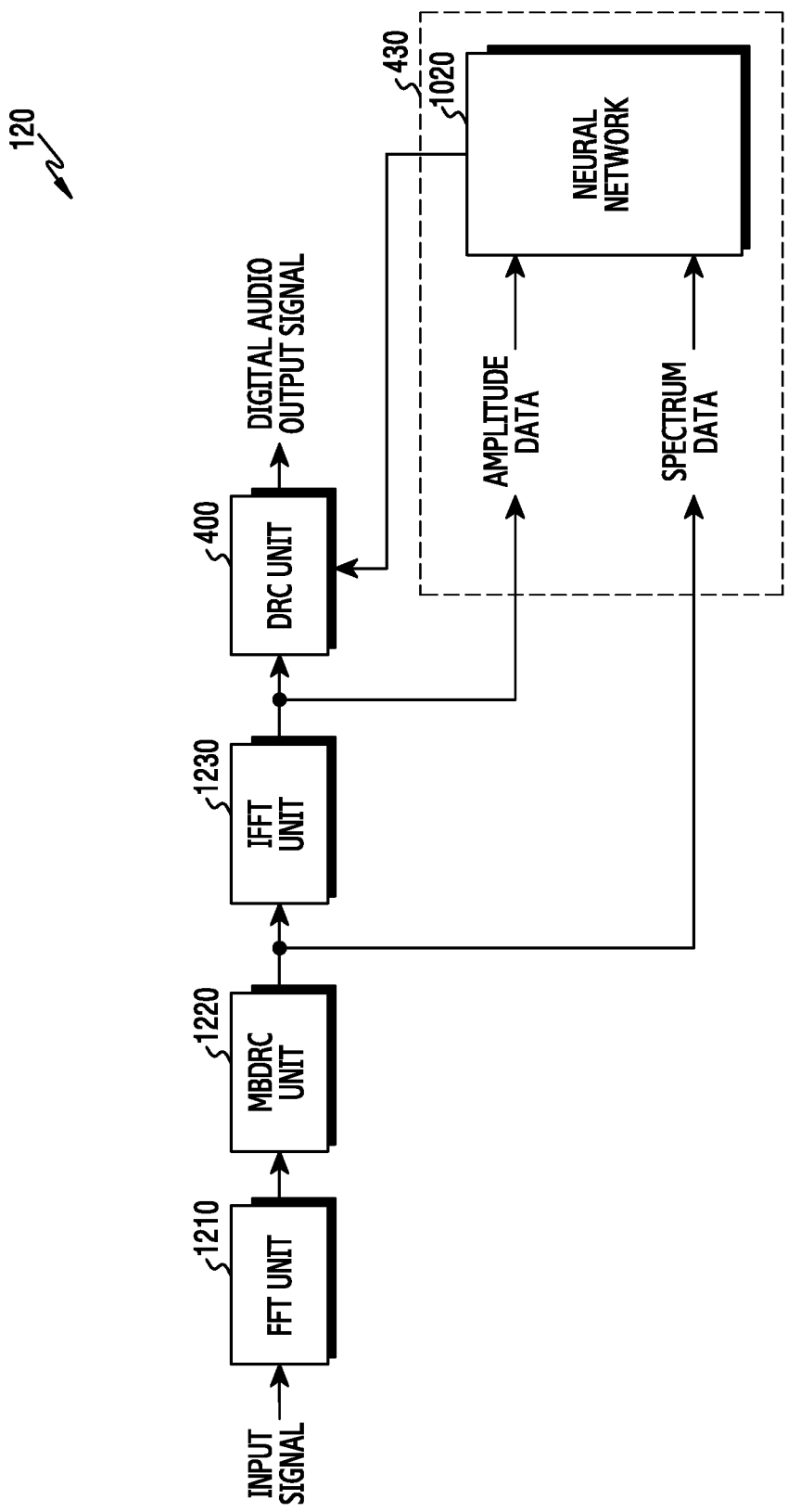
FIG. 13 is a block diagram illustrating yet another example of a functional configuration of a processor of an electronic device for adjusting a gain of a digital audio signal based on hearing recognition characteristics according to various embodiments.

FIG. 13 is a block diagram illustrating yet another example of a functional configuration of a processor of an electronic device for adjusting a gain of a digital audio signal based on hearing recognition characteristics according to various embodiments. Functions of the processor may be fulfilled by the processor 120 of FIG. 1 or the processor 120 of FIG. 3.

Referring to FIG. 13, the processor 120 may include an FFT unit (e.g., including FFT circuitry) 1210, an MBDRC unit (e.g., including MBDRC circuitry) 1220, an IFFT unit (e.g., including inverse FFT circuitry) 1230, a DRC unit (e.g., including dynamic range control circuitry) 400, and a distortion tolerance determining unit (e.g., including distortion tolerance determining circuitry) 430.

The FFT unit 1210 may receive the input signal. The FFT unit 1210 may generate the first signal by applying the FFT the input signal. The FFT unit 1210 may provide the first signal to the MBDRC unit 1220.

The MBDRC unit 1220 may receive the first signal. The MBDRC unit 1220 may generate the plurality of the signals on the subbands based on the first signal, and perform the DRC on the signals. The MBDRC unit 1220 may generate the second signal by combining the DRC-processed signals. The MBDRC unit 1220 may provide the second signal to the distortion tolerance determining unit 430. The MBDRC unit 1220 may provide the second signal to the IFFT unit 1230.

The IFFT unit 1230 may generate the third signal by applying the IFFT to the second signal. The third signal may correspond to the digital audio input signal. The IFFT unit 1230 may provide the third signal to the DRC unit 400. The IFFT unit 1230 may provide the third signal to the distortion tolerance determining unit 430.

The distortion tolerance determining unit 430 may generate spectrum data of the second signal, based on the second signal received from the MBDRC unit 1220. Unlike the distortion tolerance determining unit 430 of FIG. 12, the distortion tolerance determining unit 430 of FIG. 13 may not include the FFT unit 1010. By receiving the FFT-processed second signal from the MBDRC unit 1220, the distortion tolerance determining unit 430 may obtain spectrum data used to determine at least one parameter for the gain to be applied to the digital audio output signal, without the FFT.

The distortion tolerance determining unit 430 may generate amplitude data of the third signal, based on the third signal received from the IFFT unit 1230.

The distortion tolerance determining unit 430 may determine at least one parameter for the gain to be applied to the third signal, at the neural network 1020 based on the spectrum data and the amplitude data. The distortion tolerance determining unit 430 may provide information of the at least one parameter determined, to the DRC unit 400. In various embodiments, the distortion tolerance determining unit 430 may provide the determined at least one parameter information to at least one of the gain curve applying unit 440 of the DRC unit 400 or the gain smoothing applying unit 450 of the DRC unit 400.

The DRC unit 400 may generate the digital audio output signal, based at least in part on the received third signal and the received at least one parameter information. In various embodiments, the DRC unit 400 may determine the gain for the third signal based at least in part on the received at least one parameter information. The DRC unit 400 may generate the digital audio output signal by applying the determined gain to the third signal.

As such, the electronic device 101 according to various embodiments may lessen computational complexity at the distortion tolerance determining unit 430 by using the data acquired via the FFT performed for the MBDRC at the distortion tolerance determining unit 430.

As mentioned above, an electronic device 101 according to various embodiments may include a processor (e.g., the processor 120 of FIG. 1 or FIG. 3), wherein the processor may be configured to designate a maximum amplitude of an audio signal as a designated range, wherein designating the maximum amplitude of the audio signal as the designated range comprises processing the audio signal with the designated range according to a designated gain, to determine, based at least on hearing recognition characteristics of a human per frequency band of the processed audio signal, whether to tolerate distortion in the processed audio signal, to reduce, based at least on determining not to tolerate the distortion in the processed audio signal, a gain of the processed audio signal, and to adjust, based at least on determining to tolerate the distortion in the processed audio signal, the gain of the processed audio signal according to the hearing recognition characteristics.

In various example embodiments, the processor may be configured to identify energy distribution per frequency band of the processed audio signal, as at least part of the hearing recognition characteristics.

In various example embodiments, the processor may be configured to change the designated gain to another designated gain, based at least on determining not to tolerate the distortion in the processed audio signal.

An electronic device 101 according to various embodiments may include a speaker (e.g., the sound output device 155 of FIG. 1 or the sound output device 155 of FIG. 3) and at least one processor (e.g., the processor 120 of FIG. 1 or the processor 120 of FIG. 3) operably coupled with the speaker, wherein the at least one processor may be configured to determine whether a frequency characteristic of a digital audio signal having a first range wider than a designated range satisfies a designated condition associated with hearing characteristic of a human, in response to determining that the frequency characteristic satisfies the designated condition, to generate a first digital audio signal having a second range wider than the designated range, based at least on the digital audio signal, in response to determining that the frequency characteristic does not satisfy the designated condition, to generate a second digital audio signal having a third range narrower than the designated range, based at least on the digital audio signal, and to output, via the speaker, a first output signal generated based at least on the first digital audio signal or a second output signal generated based at least on the second digital audio signal.

In various example embodiments, the hearing characteristic may be associated with a masking effect, and the at least one processor may be configured to determine that the designated condition satisfied, if data determined based on the frequency characteristic indicates that distortion according to clipping in a signal to be output based at least on the digital audio signal is not perceived according to the masking effect.

In various example embodiments, the first output signal output via the speaker may include distortion caused by clipping. In various embodiments, the second output signal output via the speaker may not include the distortion.

In various example embodiments, the at least one processor may be configured to identify the frequency characteristic based at least on energy distribution on a frequency domain of the digital audio signal.

In various example embodiments, the digital audio signal may correspond to a first frame among a plurality of frames, and the at least one processor may be configured to determine whether a frequency characteristic of another digital audio signal corresponding to a second frame subsequent to the first frame among the frames satisfies the designated condition, in response to determining that the frequency characteristic of the another digital audio signal satisfies the designated condition, to generate a third digital audio signal with a fourth range wider than the designated range, based at least on the another digital audio signal, and to output, via the speaker, a third output signal generated based at least on the third digital audio signal. The at least one processor may be configured to determine at least one value corresponding to the frequency characteristic of the another digital audio signal, and to generate the third digital audio signal by applying a gain determined based at least on the determined at least one value to the another digital audio signal, and wherein the at least one value may include at least one of a limit gain for the another digital audio signal, a target gain for the another digital audio signal, or a reaction rate for reaching the target gain or for restoring gain from the target gain.

In various example embodiments, the at least one processor may be configured to, in response to determining that the frequency characteristic does not satisfies the designated condition, determine a second gain for changing the range of the digital audio signal to the third range, and to generate the second digital audio signal by applying the second gain to the digital audio signal.

In various example embodiments, the frequency characteristic may be determined based on first data generated by applying a gain having a specified value to the digital audio signal, the designated condition may indicate that the first data is smaller than or equal to reference data, and the reference data may be determined based on second data indicating a masking curve of the digital audio signal and third data generated by applying FFT to the digital audio signal. The reference data may be configured as a maximum value per frequency unit between the second data and the third data.

In various example embodiments, the at least one processor may be configured to generate an analog signal converted from the first digital audio signal or the second digital audio signal, and to output, via the speaker, the generated analog signal as the first output signal or the second output signal.

Figure 14:
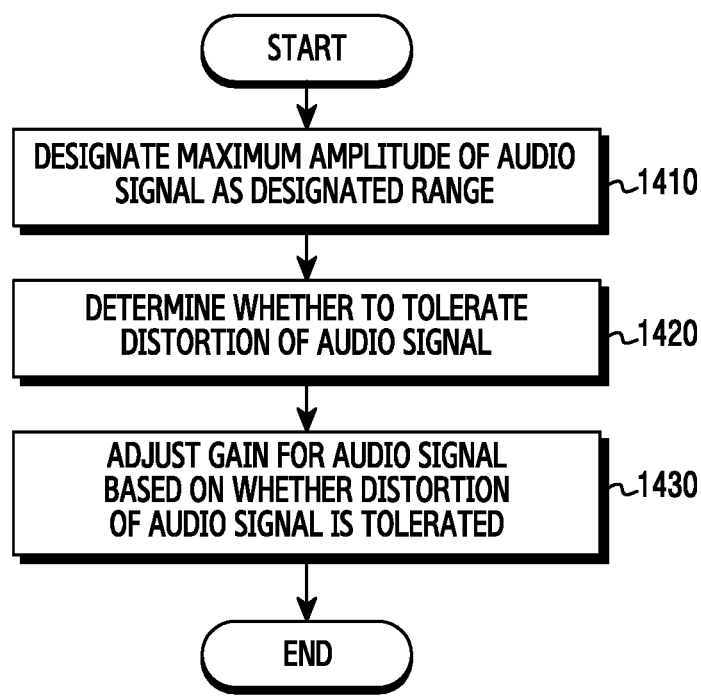
FIG. 14 is a flowchart illustrating an example of operations of an electronic device for adjusting a gain of a digital audio signal based on hearing recognition characteristics according to various embodiments.

FIG. 14 is a flowchart illustrating an example of operations of an electronic device for adjusting a gain of a digital audio signal based on hearing recognition characteristics according to various embodiments. Such operations may be performed by the electronic device 101 of FIG. 1 of FIG. 3 or the component (e.g., the processor 120 of FIG. 1 or FIG. 3) of the electronic device 101.

Referring to FIG. 14, in operation 1410, the processor 120 may designate a maximum amplitude of the audio signal as the designated range. The audio signal may correspond to a signal combining the plurality of the signals. The designated range may be configured to prevent and/or reduce saturation in the sound output process. For example, the designated range may be a 16-bit range. The processor 120 may designate the maximum amplitude of the audio signal as the designated range.

In operation 1420, the processor 120 may determine whether to tolerate a distortion of the processed audio signal, based at least in part on hearing recognition characteristics of a human per frequency band for the processed audio signal. The hearing recognition characteristics of the human may be related to the masking effect. The distortion may be the distortion according to the clipping. If the signal to be output based on the audio signal includes the distortion according to the clipping, the hearing recognition characteristics of the human may include that the human does not perceive the distortion, due to the masking effect. For example, the processor 120 may determine to tolerate the distortion, in response to determining that the human does not perceive the distortion due to the masking effect based at least in part on the hearing recognition characteristics of the human per frequency band for the processed audio signal. For example, the processor 120 may determine not to tolerate the distortion, in response to determining that the human perceives the distortion due to the masking effect based at least in part on the hearing recognition characteristics of the human per frequency band for the processed audio signal.

In operation 1430, the processor 120 may adjust a gain for the audio signal based on whether the distortion of the audio signal is tolerated or not. For example, in response to determining to tolerate the distortion, the processor 120 may adjust the gain for the audio signal to have a wider range than the designated range. The adjusted gain may be higher than the designated gain. For example, in response to determining not to tolerate the distortion, the processor 120 may adjust (or reduce) the gain for the audio signal to have a narrower range than the designated range. The adjusted gain may be lower than the designated gain.

Although not depicted in FIG. 14, the processor 120 may generate an output audio signal by applying the adjusted gain to the audio signal. The processor 120 may generate an output analog audio signal by performing digital-analog conversion on the output audio signal. The processor 120 may output the generated output analog audio signal through the sound output device 155.

As such, the electronic device 101 according to various embodiments may determine whether the user perceives the distortion according to the clipping, due to the masking effect, and thus provide the audio signal with an improved sound quality and/or volume.

Figure 15:
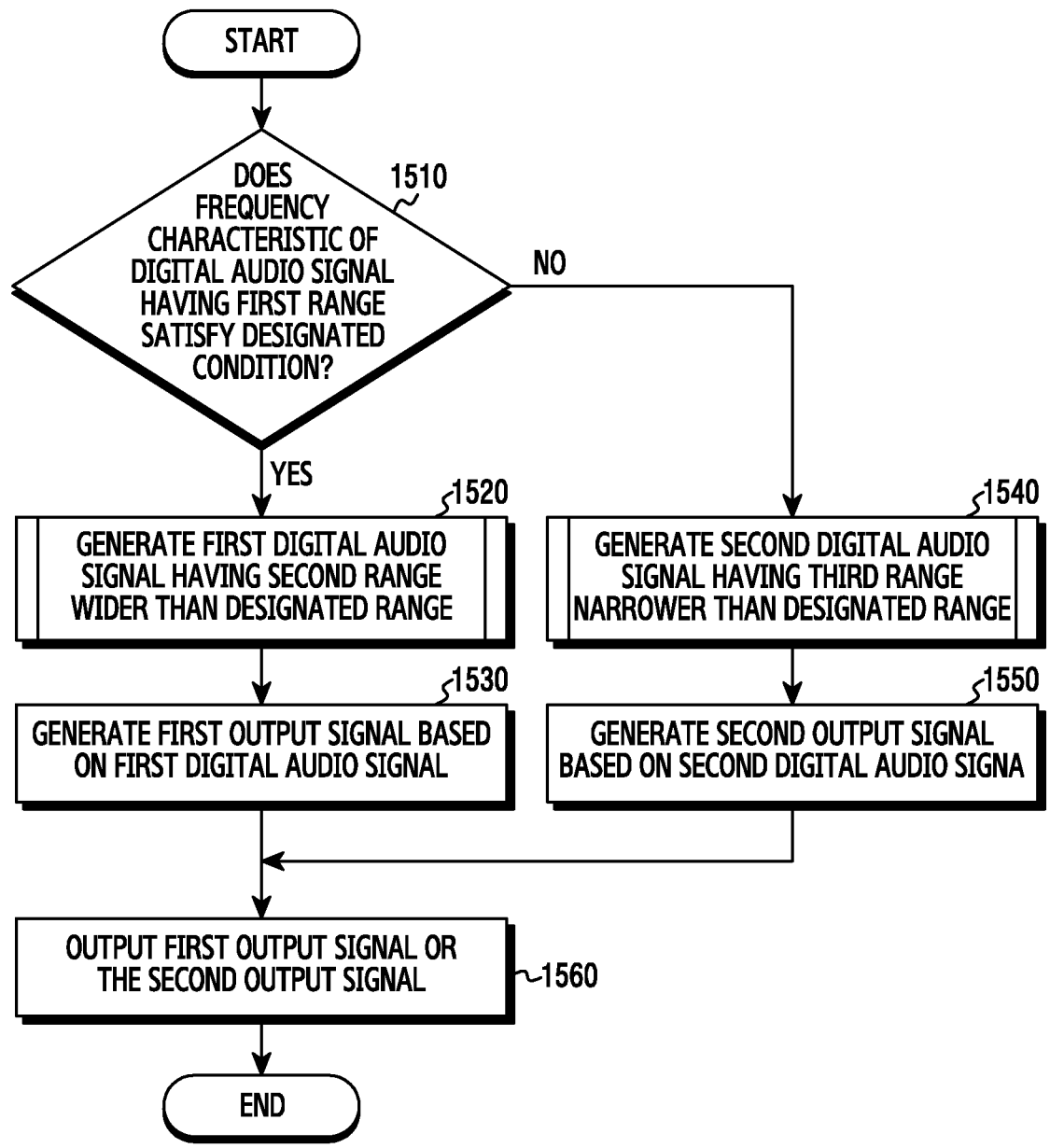
FIG. 15 is a flowchart illustrating another example of operations of an electronic device for adjusting a gain of a digital audio signal based on hearing recognition characteristics according to various embodiments.

FIG. 15 is a flowchart illustrating another example of operations of an electronic device 101 for adjusting a gain of a digital audio signal based on hearing recognition characteristics according to various embodiments. Such operations may be performed by the electronic device 101 of FIG. 1 of FIG. 3 or the component (e.g., the processor 120 of FIG. 1 or FIG. 3) of the electronic device 101.

Referring to FIG. 15, in operation 1510, the processor 120 may determine whether a frequency characteristic of a digital audio signal having a first range wider than a designated range satisfies a designated condition. The digital audio signal may be introduced from a sound source. The digital audio signal may correspond to a signal generated by combining a plurality of MBDRC-processed signals. The designated range may be configured to prevent and/or reduce saturation in the sound output process. The frequency characteristic of the digital audio signal may be related to an amplitude or energy distribution on the frequency domain of the digital audio signal. In various embodiments, the processor 120 may determine whether the frequency characteristic of the digital audio signal having the first range wider than the designated range satisfies the designated condition relating to hearing characteristics of the human. The hearing characteristics may be related to the masking effect, and the designated condition may include that the data determined based on the frequency characteristic estimates that the distortion according to the clipping in the signal to be output based on the digital audio signal is not perceived according to the masking effect.

For example, the processor 120 may obtain energy distribution information on the frequency domain of the digital audio signal. By determining based on the obtained information whether the user perceives the distortion according to the clipping in the signal to be output, according to the masking effect, the processor 120 may determine whether the frequency characteristic of the digital audio signal satisfies the designated condition.

For example, the processor 120 may obtain amplitude data on the frequency domain of the digital audio signal. The processor 120 may compare the obtained data with reference information of the masking effect. The reference information may be generated by machine learning or deep learning. The reference information may include information indicating relationship between the frequency characteristic and the masking effect. For example, if the distortion according to the clipping is included in the audio signal to be output based at least in part on the digital audio signal having specific amplitude or specific energy distribution on the frequency domain, the reference information may include information about whether the user perceives the distortion according to the masking effect or information about a probability that the user does not perceive the distortion according to the masking effect. Based on the comparison, by determining whether the distortion according to the clipping in the output signal is masked by the masking effect, the processor 120 may determine whether the frequency characteristic of the digital audio signal satisfies the designated condition.

In various example embodiments, the processor 120 may determine first data generated by applying a gain of a specific value to the digital audio signal, as the frequency characteristic. The processor 120 may generate reference data for the digital audio signal. The reference data may be determined based on second data indicating a masking curve of the digital audio signal and third data generated by applying the FFT to the digital audio signal. For example, the reference data may include a maximum value per frequency unit between the second data and the third data. The reference data may be determined based on Equation 1. If the first data is smaller than or equal to the reference data, the processor 120 may determine that the frequency characteristic satisfies the designated condition.

In response to determining that the frequency characteristic satisfies the designated condition, the processor 120 may perform operation 1520. In response to determining that the frequency characteristic does not satisfy the designated condition, the processor 120 may perform operation 1540.

In response to determining that the frequency characteristic of the digital audio signal satisfies the designated condition, the processor 120 may generate a first digital audio signal having a second range wider than the designated range based on the digital audio signal in operation 1520. Since the first digital audio signal has the second range wider than the designated range, the audio signal to be output based on the digital audio signal may include distortion according to the clipping. Since the distortion according to the clipping in the audio signal to be output is not perceived by the user according to the masking effect, the audio signal to be output, which includes the distortion, may exhibit an improved sound quality and/or volume.

In operation 1530, the processor 120 may generate a first output signal based on the first digital audio signal. For example, the processor 120 may generate an analog signal converted from the first digital audio signal, as the first output signal.

In response to determining that the frequency characteristic does not satisfy the designated condition, the processor 120 may generate a second digital audio signal having a third range narrower than the designated range based on the digital audio signal in operation 1540. Since the second digital audio signal has the third range narrower than the designated range, the audio signal to be output based on the second digital audio signal may not include the distortion according to the clipping. The audio signal to be output, which does not include the distortion, may exhibit an improved sound quality and/or volume.

In operation 1550, the processor 120 may generate a second output signal based on the second digital audio signal. For example, the processor 120 may generate an analog signal converted from the second digital audio signal, as the second output signal.

In operation 1560, the processor 120 may output the first output signal or the second output signal through, for example, the speaker (e.g., the sound output device 155 of FIG. 1 or FIG. 3). The first output signal, which may include the distortion according to the clipping but is not perceived by the user according to the masking effect, may exhibit an improved sound quality and/or volume. The second output signal, which does not include the distortion according to the clipping which may be perceived by the user, may exhibit an improved sound quality and/or volume.

At least part of operation 1510 through operation 1560 of FIG. 15 may be fulfilled per frame or per sample. For example, the processor 120 may perform at least part of operation 1510 through operation 1560 on a digital audio signal corresponding to a first frame among multiple frames, and perform at least part of operation 1510 through operation 1560 on another digital audio signal corresponding to a second frame which is subsequent to the first frame among the multiple frames.

Figure 16:
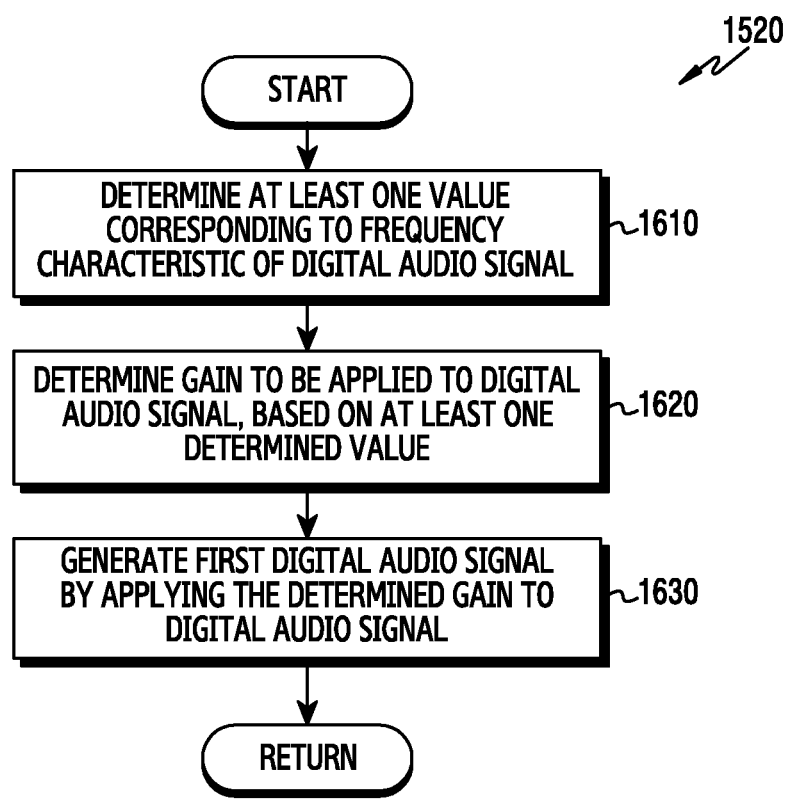
FIG. 16 is a flowchart illustrating an example of operations of an electronic device for generating a first digital audio signal according to various embodiments.

FIG. 16 is a flowchart illustrating an example of operations of an electronic device 101 for generating a first digital audio signal according to various embodiments. Such operations may be performed by the electronic device 101 of FIG. 1 of FIG. 3 or the component (e.g., the processor 120 of FIG. 1 or FIG. 3) of the electronic device 101.

Operations 1610, 1620, and 1630 of FIG. 16 may, for example, be related to operation 1520 of FIG. 15.

Referring to FIG. 16, in operation 1610, the processor 120 may determine at least one value corresponding to a frequency characteristic of a digital audio signal. By considering that distortion according to the clipping is tolerated in an audio signal to be output based on the digital audio signal, the processor 120 may determine at least one value corresponding to the frequency characteristic of the digital audio signal. The at least one value may be set in at least one parameter for determining a gain to be applied to the digital audio signal. The at least one parameter may include at least one of a limit gain for the digital audio signal, a target gain for the digital audio signal, or a reaction rate for reaching the target gain (e.g., attack time) or restoring the gain from the target gain (e.g., release time).

In operation 1620, based on the at least one determined value, the processor 120 may determine a gain to be applied to the digital audio signal. For example, the processor 120 may determine at least one other value, which used to determine the gain, related to at least one other parameter than the parameter of the value determined in operation 1610. The processor 120 may determine the gain to be applied to the digital audio signal, based at least in part on the at least one value determined in operation 1610 and the at least one other value determined in operation 1620.

In operation 1630, the processor 120 may generate the first digital audio signal by applying the determined gain to the digital audio signal.

Figure 17:
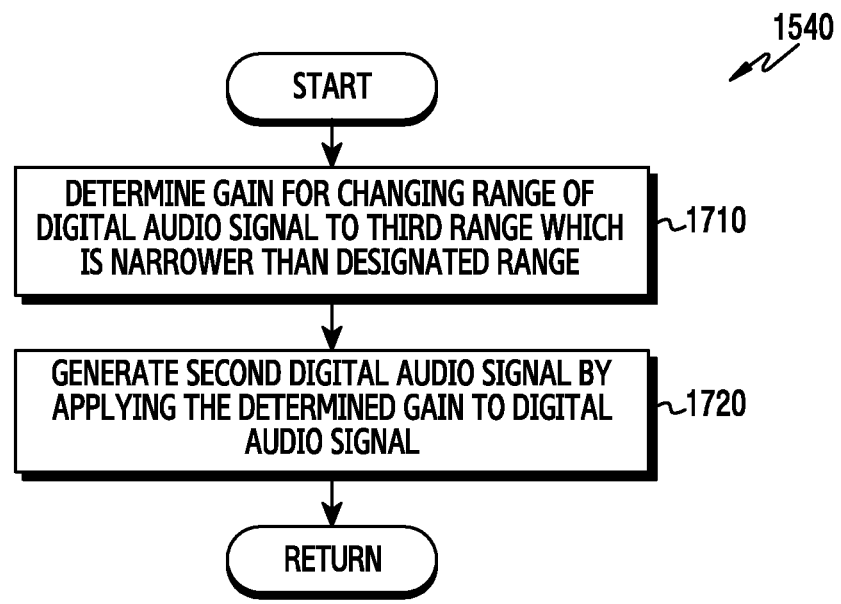
FIG. 17 is a flowchart illustrating an example of operations of an electronic device for generating a second digital audio signal according to various embodiments.

FIG. 17 is a flowchart illustrating an example of operations of an electronic device 101 for generating a second digital audio signal according to various embodiments. Such operations may be performed by the electronic device 101 of FIG. 1 of FIG. 3 or the component (e.g., the processor 120 of FIG. 1 or FIG. 3) of the electronic device 101.

Operations 1710 and 1720 of FIG. 17 may, for example, be related to operation 1540 of FIG. 15.

Referring to FIG. 17, in operation 1710, the processor 120 may determine a gain for changing the range of the digital audio signal to the third range which is narrower than the designated range. The processor 120, which estimates that the signal to be output based on the digital audio signal includes the distortion according to the clipping perceived by the user in the previous operation, may determine the gain for changing the range of the digital audio signal to the third range which is narrower than the designated range, not to include the distortion according to the clipping in the signal to be output. For example, the processor 120 may determine the gain of the digital audio signal based at least in part on the frequency characteristic of the digital audio signal.

In operation 1720, the processor 120 may generate the second digital audio signal by applying the determined gain to the digital audio signal.

Figure 18:
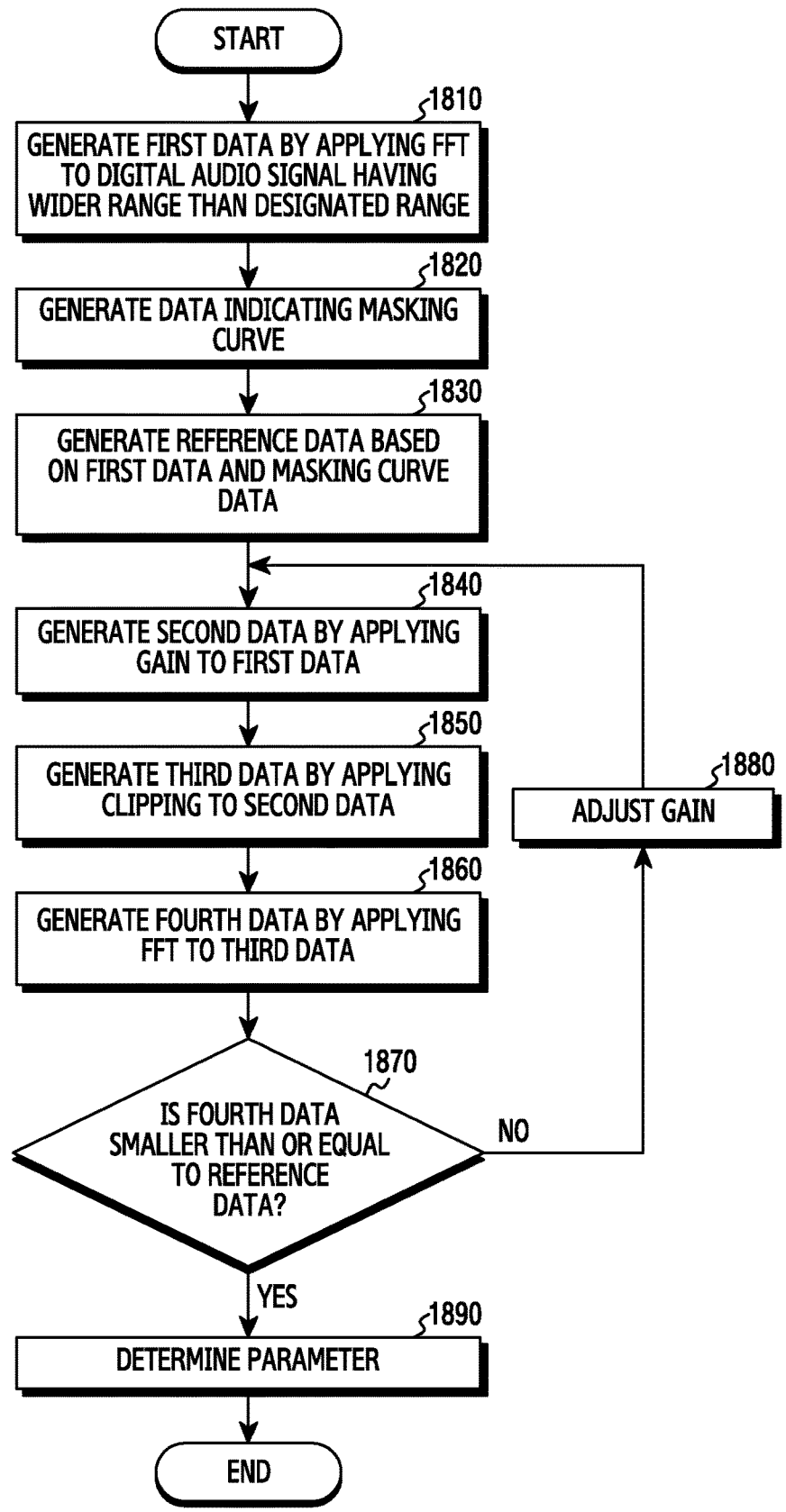
FIG. 18 is a flowchart illustrating yet another example of operations of an electronic device for adjusting a gain of a digital audio signal based on hearing recognition characteristics according to various embodiments.

FIG. 18 is a flowchart illustrating yet another example of operations of an electronic device for adjusting a gain of a digital audio signal based on hearing recognition characteristics according to various embodiments. Such operations may be performed by the electronic device 101 of FIG. 1 of FIG. 3 or the component (e.g., the processor 120 of FIG. 1 or FIG. 3) of the electronic device 101.

Referring to FIG. 18, in operation 1810, the processor 120 may generate first data by applying the FFT to a digital audio signal having a wider range than the designated range. The first data may be used to generate reference data for determining whether distortion according to clipping in the digital audio signal is perceived.

In operation 1820, the processor 120 may generate data indicating a masking curve for the digital audio signal. The masking curve data may be generated based on the standard such as MPEG-1.

In operation 1830, the processor 120 may generate the reference data based on the first data and the masking curve data. The reference data may be generated based at least in part on a maximum value per frequency bin of the first data and the masking curve data. For example, the reference data may be generated based on Equation 1.

In operation 1840, the processor 120 may generate second data by applying a gain to the first data. In operation 1840, the gain may not be a determined value. In operation 1840, the gain may be adjusted in operation 1880. For example, in operation 1840, the gain may have an initial value. For example, in operation 1840, the gain may have a value adjusted in operation 1880.

In operation 1850, the processor 120 may generate third data by clipping the second data. If the second data has a wider range than the designated range, the processor 120 may process the second data to obtain the designated range. In various embodiments, the processor 120 may change at least one value greater than a maximum value of the designated range in the second data, to the maximum value of the designated range, and change (e.g., clip the second data) at least one value smaller than a minimum value of the designated range in the second data, to the minimum value of the designated range. For example, the processor 120 may generate the third data based on Equation 2.

In operation 1860, the processor 120 may generate fourth data by applying the FFT to the third data.

In operation 1870, the processor 120 may determine (or identify) whether the fourth data is smaller than or equal to the reference data. If at least part of the fourth data is greater than the reference data, it may indicate that the audio signal to be output based on the digital audio signal includes the distortion according to the clipping perceivable to the user. On the other hand, if at least part of the fourth data is smaller than or equal to the reference data, it may indicate that the audio signal to be output based on the digital audio signal may include the distortion according to the clipping not perceivable to the user. In response to determining that the fourth data is smaller than or equal to the reference data, the processor 120 may perform operation 1890. In response to determining that the fourth data is greater than the reference data, the processor 120 may perform operation 1880.

If the fourth data is greater than the reference data, the processor 120 may adjust the gain in operation 1880. In various embodiments, the processor 120 may adjust at least part of at least one parameter for the gain applied in operation 1840. For example, the processor 120 may adjust one or more of the target gain, the limit gain, the attack time, or the release time, for the gain applied in operation 1840. In various embodiments, the processor 120 may adjust the gain applied in operation 1840, with a different gain.

The processor 120 may re-perform operation 1840 through operation 1870 based on the gain adjusted in operation 1880 or the at least one parameter adjusted in operation 1880.

If the fourth data is smaller than or equal to the reference data, the processor 120 may determine the at least one parameter for the gain applied in operation 1840, as the parameter for the gain to be applied to the digital audio signal in operation 1890.

Although not depicted in FIG. 18, the processor 120 may generate the output signal by applying the gain determined based on the determined parameter, to the digital audio signal. Although the output signal includes the distortion according to the clipping, since the distortion according to the clipping may not be perceived by the user, the electronic device 101 according to various embodiments may provide (or output) the output signal having an improved sound quality or value.

As mentioned above, a method of an electronic device according to various embodiments may include designating a maximum amplitude of an audio signal as a designated range, processing the audio signal with the designated range according to a designated gain, determining, based at least on hearing recognition characteristics of a human per frequency band of the processed audio signal, whether to tolerate distortion in the processed audio signal, reducing, based at least on determining not to tolerate the distortion in the processed audio signal, a gain of the processed audio signal, and adjusting, based at least on determining to tolerate the distortion in the processed audio signal, the gain of the processed audio signal according to the hearing recognition characteristics.

In various example embodiments, the method may include identifying energy distribution per frequency band of the processed audio signal, as at least part of the hearing recognition characteristics.

In various example embodiments, the method may include changing the designated gain to another designated gain, based at least on determining not to tolerate the distortion in the processed audio signal.

A method of an electronic device according to various embodiments may include determining whether a frequency characteristic of a digital audio signal having a first range wider than a designated range satisfies a designated condition associated with hearing characteristic of a human, in response to determining that the frequency characteristic satisfies the designated condition, generating a first digital audio signal having a second range wider than the designated range, based at least on the digital audio signal, in response to determining that the frequency characteristic does not satisfy the designated condition, generating a second digital audio signal having a third range narrower than the designated range, based at least on the digital audio signal, and outputting, via the speaker, a first output signal generated based at least on the first digital audio signal or a second output signal generated based at least on the second digital audio signal.

In various example embodiments, the hearing characteristic may be associated with a masking effect, and the designated condition may include that data determined based on the frequency characteristic indicates that distortion according to clipping in a signal to be output based at least on the digital audio signal is not perceived according to the masking effect.

In various example embodiments, the first output signal output via the speaker may include distortion caused by clipping, and the second output signal output via the speaker may not include the distortion.

In various example embodiments, the frequency characteristic may be determined based on energy distribution on a frequency domain of the digital audio signal.

In various example embodiments, the digital audio signal may correspond to a first frame among a plurality of frames, and the at least one processor may be configured to determine whether a frequency characteristic of another digital audio signal corresponding to a second frame subsequent to the first frame among the frames satisfies the designated condition, in response to determining that the frequency characteristic of the another digital audio signal satisfies the designated condition, to generate a third digital audio signal with a fourth range wider than the designated range, based at least on the another digital audio signal, and to output, via the speaker, a third output signal generated based at least on the third digital audio signal. The at least one processor may be configured to determine at least one value corresponding to the frequency characteristic of the another digital audio signal, and to generate the third digital audio signal by applying a gain determined based at least on the determined at least one value to the another digital audio signal, and wherein the at least one value may include at least one of a limit gain for the another digital audio signal, a target gain for the another digital audio signal, or a reaction rate for reaching the target gain or for restoring gain from the target gain.

In various example embodiments, generating the second digital audio signal may include, in response to determining that the frequency characteristic does not satisfies the designated condition, determining a second gain for changing the range of the digital audio signal to the third range, and generating the second digital audio signal by applying the second gain to the digital audio signal.

In various example embodiments, the frequency characteristic may be determined based on first data generated by applying a gain having a specified value to the digital audio signal, the designated condition may indicate that the first data is smaller than or equal to reference data, and the reference data may be determined based on second data indicating a masking curve of the digital audio signal and third data generated by applying FFT to the digital audio signal. The reference data may be configured as a maximum value per frequency unit between the second data and the third data.

In various example embodiments, the digital audio signal may be generated by combining MBDRC-processed signals.

In various example embodiments, outputting the first digital audio signal or the second digital audio signal may include generating an analog signal converted from the first digital audio signal or the second digital audio signal, and outputting, via the speaker, the generated analog signal as the first output signal or the second output signal.

The methods according to the embodiments described in the claims or the specification of the present disclosure may be implemented in software, hardware, or any combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the present disclosure.

Such a program (software module, software) may, for example, and without limitation, be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. The program may be stored to a memory combining part or all of those recording media. A plurality of memories may be equipped.

The program may be stored in an attachable storage device accessible via a communication network such as Internet, Intranet, local area network (LAN), wide LAN (WLAN), or storage area network (SAN), or a communication network by combining these networks. The storage device may access the electronic device through an external port. A separate storage device may access the present device over the communication network.

In the various example embodiments of the present disclosure, the elements included in the disclosure are expressed in a singular or plural form. However, the singular or plural expression is appropriately selected according to a proposed situation for the convenience of explanation and the present disclosure is not limited to a single element or a plurality of elements. The elements expressed in the plural form may be configured as a single element, and the elements expressed in the singular form may be configured as a plurality of elements.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a speaker; and
at least one processor operably coupled with the speaker, wherein the at least one processor is configured to:
determine whether a frequency characteristic of a digital audio signal having a first range wider than a designated range satisfies a designated condition associated with a hearing characteristic of a human;
generate, in response to determining that the frequency characteristic satisfies the designated condition, a first digital audio signal having a second range wider than the designated range based at least on the digital audio signal;
generate, in response to determining that the frequency characteristic does not satisfy the designated condition, a second digital audio signal having a third range narrower than the designated range based at least on the digital audio signal; and
output, via the speaker, a first output signal generated based at least on the first digital audio signal or output a second output signal generated based at least on the second digital audio signal,
wherein the frequency characteristic is determined based on first data generated by applying a gain having a specified value to the digital audio signal,
the designated condition indicates that the first data is smaller than or equal to reference data, and
the reference data is determined based on second data indicating a masking curve of the digital audio signal and third data generated by applying fast fourier transform (FFT) to the digital audio signal.

2. The electronic device of claim 1, wherein the hearing characteristic is associated with a masking effect, and
the at least one processor is configured to determine that the designated condition satisfied if data determined based on the frequency characteristic indicates that distortion according to clipping in a signal to be output based at least on the digital audio signal is not perceived based on the masking effect.

3. The electronic device of claim 1, wherein the first output signal output via the speaker includes distortion caused by clipping.

4. The electronic device of claim 3, wherein the second output signal output via the speaker does not include the distortion.

5. The electronic device of claim 1, wherein the at least one processor is configured to determine the frequency characteristic based at least on energy distribution on a frequency domain of the digital audio signal.

6. The electronic device of claim 1, wherein the digital audio signal corresponds to a first frame among a plurality of frames, and
the at least one processor is configured to:
determine whether a frequency characteristic of another digital audio signal corresponding to a second frame subsequent to the first frame among the plurality of frames satisfies the designated condition;
generate, in response to determining that the frequency characteristic of the another digital audio signal satisfies the designated condition, a third digital audio signal with a fourth range wider than the designated range based at least on the another digital audio signal; and
output, via the speaker, a third output signal generated based at least on the third digital audio signal.

7. The electronic device of claim 6, wherein the at least one processor is configured to:
determine at least one value corresponding to the frequency characteristic of the another digital audio signal; and
generate the third digital audio signal by applying a gain determined based at least on the determined at least one value to the another digital audio signal, and
wherein the at least one value includes at least one of a limit gain for the another digital audio signal, a target gain for the another digital audio signal, a reaction rate for reaching the target gain or for restoring gain from the target gain.

8. The electronic device of claim 1, wherein the at least one processor is configured to,
determine a another gain for changing the digital audio signal to the third range in response to determining that the frequency characteristic does not satisfy the designated condition; and
generate the second digital audio signal by applying the another gain to the digital audio signal.

9. The electronic device of claim 1, wherein the reference data includes a maximum value per frequency unit between the second data and the third data.

10. The electronic device of claim 1, wherein the at least one processor is configured to:
generate an analog signal converted from the first digital audio signal or the second digital audio signal; and
output, via the speaker, the generated analog signal as the first output signal or the second output signal.

11. A method of operating an electronic device, comprising:
determining whether a frequency characteristic of a digital audio signal having a first range wider than a designated range satisfies a designated condition associated with a hearing characteristic of a human;
generating, in response to determining that the frequency characteristic satisfies the designated condition, a first digital audio signal having a second range wider than the designated range, based at least on the digital audio signal;
generating, in response to determining that the frequency characteristic does not satisfy the designated condition, a second digital audio signal having a third range narrower than the designated range, based at least on the digital audio signal; and outputting, via the speaker, a first output signal generated based at least on the first digital audio signal or a second output signal generated based at least on the second digital audio signal, wherein the frequency characteristic is determined based on first data generated by applying a gain having a specified value to the digital audio signal, the designated condition indicates that the first data is smaller than or equal to reference data, and the reference data is determined based on second data indicating a masking curve of the digital audio signal and third data generated by applying fast Fourier transform (FFT) to the digital audio signal.

12. The method of claim 11, wherein the hearing characteristic of a human is associated with a masking effect, and the designated condition includes that data determined based on the frequency characteristic indicates that distortion according to clipping in a signal to be output based at least on the digital audio signal is not perceived based on the masking effect.

13. The method of claim 11, wherein the first output signal output via the speaker includes distortion caused by clipping.

14. The method of claim 13, wherein the second output signal output via the speaker does not include the distortion.

15. The method of claim 11, wherein the reference data is configured as a maximum value per frequency unit between the second data and the third data.

* * * * *